US012590274B2

(12) United States Patent
Hoogboom et al.

(10) Patent No.: US 12,590,274 B2
(45) Date of Patent: Mar. 31, 2026

(54) COMPOSITION AND PROCESS FOR SELECTIVELY ETCHING A HARD MASK AND/OR AN ETCH-STOP LAYER IN THE PRESENCE OF LAYERS OF LOW-K MATERIALS, COPPER, COBALT AND/OR TUNGSTEN

(71) Applicant: BASF SE, Ludwigshafen am Rhein (DE)

(72) Inventors: Joannes Theodorus Valentinus Hoogboom, BP Eindhoven (NL); Andreas Klipp, Ludwigshafen (DE); Jhih Jheng Ke, Taoyuan (TW); Che Wei Wang, Taoyuan (TW); Chia Ching Ting, Taoyuan (TW)

(73) Assignee: BASF SE, Ludwigshafen am Rhein (DE)

( * ) Notice: Subject to any disclaimer, the term of this patent is extended or adjusted under 35 U.S.C. 154(b) by 894 days.

(21) Appl. No.: 17/613,337

(22) PCT Filed: May 20, 2020

(86) PCT No.: PCT/EP2020/064144
§ 371 (c)(1),
(2) Date: Nov. 22, 2021

(87) PCT Pub. No.: WO2020/234395
PCT Pub. Date: Nov. 26, 2020

(65) Prior Publication Data

US 2022/0220421 A1 Jul. 14, 2022

(30) Foreign Application Priority Data

May 23, 2019 (EP) .................................... 19176290

(51) Int. Cl.

| | |
|---|---|
| ***C11D 3/30*** | (2006.01) |
| ***C09K 13/00*** | (2006.01) |
| ***C11D 3/00*** | (2006.01) |
| ***C11D 3/20*** | (2006.01) |
| ***C11D 3/28*** | (2006.01) |
| ***C11D 3/34*** | (2006.01) |
| ***C11D 3/39*** | (2006.01) |
| ***C11D 3/395*** | (2006.01) |
| ***C11D 7/32*** | (2006.01) |
| ***C11D 7/50*** | (2006.01) |
| ***H01L 21/02*** | (2006.01) |

(52) U.S. Cl.
CPC ............ *C11D 7/3281* (2013.01); *C09K 13/00* (2013.01); *C11D 3/0073* (2013.01); *C11D 3/2041* (2013.01); *C11D 3/28* (2013.01); *C11D 3/30* (2013.01); *C11D 3/3454* (2013.01); *C11D 3/39* (2013.01); *C11D 3/3902* (2013.01); *C11D 3/395* (2013.01); *C11D 7/3209* (2013.01); *C11D 7/50* (2013.01); *H01L 21/02057* (2013.01); *C11D 2111/22* (2024.01)

(58) Field of Classification Search
CPC ........... C11D 3/2041; C11D 3/28; C11D 3/30; C11D 3/39; C11D 3/3902; C11D 3/395; C11D 7/3209; C11D 7/3281; C11D 7/50
USPC ....... 510/175, 176, 254, 477, 488, 499, 500, 510/504, 505, 506, 493
See application file for complete search history.

(56) References Cited

U.S. PATENT DOCUMENTS

| | | | | |
|---|---|---|---|---|
| 7,922,824 | B2 | 4/2011 | Minsek et al. | |
| 9,546,321 | B2 | 1/2017 | Barnes et al. | |
| 11,978,622 | B2 * | 5/2024 | Song | C11D 7/28 |
| 2005/0197265 | A1 * | 9/2005 | Rath | G03F 7/423 510/175 |
| 2009/0215658 | A1 | 8/2009 | Minsek et al. | |
| 2011/0186086 | A1 | 8/2011 | Minsek et al. | |
| 2015/0104952 | A1 | 4/2015 | Cui | |
| 2016/0130500 | A1 | 5/2016 | Chen et al. | |
| 2018/0148669 | A1 | 5/2018 | Payne et al. | |
| 2018/0204764 | A1 | 7/2018 | Cooper et al. | |

FOREIGN PATENT DOCUMENTS

WO 2008080097 A2 7/2008

OTHER PUBLICATIONS

International Search Report and Written Opinion for corresponding PCT/EP2020/064144 mailed Oct. 22, 2020, 8 pages.

* cited by examiner

*Primary Examiner* — Gregory R Delcotto
(74) *Attorney, Agent, or Firm* — Armstrong Teasdale LLP

(57) ABSTRACT

Described herein is a method of using a cleaning composition in combination with one or more oxidants for removing post-etch or post-ash residue from the surface of a semiconductor substrate and/or for oxidative etching or partially oxidative etching of a layer or mask. Also described herein is the cleaning composition and a method of using the cleaning composition for removing post-etch or post-ash residue from the surface of a semiconductor substrate. Also described herein is a wet-etch composition including the cleaning composition and one or more oxidants as well as a method of using the wet-etch composition. Also described herein are a process for the manufacture of a semiconductor device from a semiconductor substrate and a kit including the cleaning composition and one or more oxidants.

3 Claims, No Drawings

COMPOSITION AND PROCESS FOR SELECTIVELY ETCHING A HARD MASK AND/OR AN ETCH-STOP LAYER IN THE PRESENCE OF LAYERS OF LOW-K MATERIALS, COPPER, COBALT AND/OR TUNGSTEN

CROSS-REFERENCE TO RELATED APPLICATIONS

This application is a U.S. National Phase Application of International Patent Application No. PCT/EP2020/064144, filed May 20, 2020, which claims priority to European Patent Application No. 19176290.5, filed May 23, 2019, the entire contents of which are hereby incorporated by reference herein.

The present invention pertains to the use of a cleaning composition in combination with one or more oxidants for removing post-etch or post-ash residue from the surface of a semiconductor substrate and/or for oxidative etching or partially oxidative etching of a layer or mask comprising or consisting of a material selected from the group consisting of TiN, Ta, TaN, Al and $HfO_x$ and/or a layer or mask comprising or consisting of a material selected from the group consisting of tungsten carbide ($WC_x$) and tungsten nitride ($WN_x$) and/or for removing from the surface of a semiconductor substrate a layer comprising an aluminium compound. The invention further pertains to said cleaning composition and to a use of said cleaning composition for removing post-etch or post-ash residue from the surface of a semiconductor substrate. Under a further aspect, the present invention also pertains to a wet-etch composition comprising said cleaning composition and one or more oxidants, as well as to the use of said wet-etch composition. The present invention also relates to a process for the manufacture of a semiconductor device from a semiconductor substrate and to a kit comprising said cleaning composition and one or more oxidants.

Processes for manufacturing semiconductor devices are multiple-step sequences of photolithographic and chemical processing steps during which electronic circuits are gradually created on a substrate, typically a wafer, made of pure semiconducting material (a "semiconductor substrate", specifically a "semiconductor wafer"). Preferably, silicon is used as the semiconductor material. A typical semiconductor substrate (wafer) is made out of extremely pure silicon that is grown into mono-crystalline cylindrical ingots (boules) up to 300 mm in diameter using the so-called "Czochralski process". These ingots are then sliced into wafers about 0.75 mm thick and polished to obtain a very regular and flat surface.

The particular process for manufacturing semiconductor wafers is structured in several phases, comprising e.g. the so-called "front-end-of-line" ("FEOL") and "back-end-of-line" ("BEOL") processing phases.

The FEOL processing phase refers to the formation of transistors directly in the material (usually the silicon) of the semiconductor wafer. The raw semiconductor wafer is engineered by the growth of an ultrapure, virtually defect-free silicon layer through epitaxy. Front-end surface engineering is followed by growth of the gate dielectric (e.g. silicon dioxide), patterning of the gate, patterning of the source and drain regions, and subsequent implantation or diffusion of dopants into the semiconducting material to obtain the desired complementary electrical properties.

Once the various devices (e.g. dynamic random access memories, DRAMs; static random access memories, SRAMs; electrically programmable read only memories, EPROMs; or complementary metal on silicon, CMOS) have been created in FEOL processing, they must be interconnected to form the desired electrical circuits. This occurs in a series of wafer processing steps collectively referred to as BEOL. The BEOL processing phase involves creating metal interconnecting wires on the semiconductor wafer's surface that are isolated by layers made of material with low dielectric constant, e.g. a material which has a dielectric constant $\kappa<3.9$ (also known as a "low-k material"). With the introduction of copper (Cu) and recently also cobalt (Co) as electrically conductive materials instead of aluminium, sophisticated multiple-step manufacturing processes for forming Integrated Circuit (IC) interconnects on semiconductor substrates have been developed, comprising various methods for selectively creating and removing consecutive layers of electrically conductive and of insulating (dielectric) materials, e.g. using chemical vapour deposition (CVD), electroplating, photolithography, wet etching or dry etching techniques, chemical-mechanical polishing (CMP), as well as several cleaning steps, e.g. to remove residues from previous material removing steps from the surface of a processed semiconductor substrate.

One such multiple-step manufacturing process is known as damascene manufacturing process with its variants like the dual damascene process, including the TFVL ("trench-first-via-last") dual damascene process, the VFTL ("via-first-trench-last") dual damascene process, the self-aligned dual damascene process or the dual damascene patterning process with metal-containing hard mask (for the latter see e.g. document U.S. Pat. No. 6,696,222).

In the damascene processing technology, the desired IC interconnect structure is patterned by etching the shape of the structure into the underlying inter-layer dielectric ("ILD") materials. After the patterning, typically a thin barrier layer (e.g. made of Ta/TaN, TiN, CoWP, NiMoP or NiMoB) is deposited on top of the etched structure as copper diffusion barrier. On top of that barrier layer a seed layer is often deposited which supports better adhesion of the copper on the underlying material and acts as catalytic material during the plating process as well. Typical materials for these seed layers are compounds which include Pd, Co, or other compounds, e.g. of polymers and organic materials. The original deposition process (damascene process) was designed to process each layer on its own. Hence, the so called "vertical interconnect accesses" ("vias") and the metallization levels have different process steps and demand a sequence of cleaning, material deposition, CMP, and another cleaning step for each layer. A copper technology using this sequence for its metallization levels as well as for its ILDs and inter via dielectrics ("IVD"s) is often called a "single damascene process". Typically, in the single damascene process each level requires its own cap layer or etch-stop layer, a separate ILD layer, and at the top there is a need for a material—for instance $SiO_2$—that can be polished together with the interconnect metal copper. Alternatively, the dual damascene processing technology combines certain similar process steps to one single process step, thus reducing the number of process steps and the time and costs required to build the BEOL stack. Hence the dual damascene process fabricates the IVD and the metallization layer at once.

In said damascene manufacturing process or its variants, electrically conductive masks (or "hard masks") are often used to protect one or more subjacent layers, e.g. subjacent layers of dielectric material, like of low-k material, during certain etch steps. Such electrically conductive ("metal")

masks (or "hard masks") are usually deposited in the form of a layer comprising e.g. Ti, TiN, Ta, TaN, Al or $HfO_x$ (i.e. hafnium oxide) and/or in the form of a layer comprising e.g. tungsten carbide ($WC_x$) or tungsten nitride ($WN_x$). For example, in the dual damascene patterning process with metal-containing hard mask, a metallic layer deposited on the dielectric (low-k) material serves as hard mask for a second etch step.

With the ongoing requirement to further minimize the structures on a semiconductor substrate, in particular on a semiconductor wafer, manufacturers are facing new challenges: for example, in integration schemes for further minimized structures on semiconductor wafers like in integration schemes for manufacturing 10 nm structures or sub-10 nm structures or for manufacturing 7 nm structures or sub-7 nm structures on semiconductor wafers, via creation is preferably done by using a metal-containing hard mask, often a TiN hard mask, and a subsequent dry etch step to remove the low-k material which is situated underneath the metall-containing hard mask (e.g. a Ti-containing hard mask like a TiN hardmask) and is optionally separated from the metal-containing/TiN hardmask by an additional layer, e.g. by a hard mask not containing metal or by a bonding layer. In order to protect the underlying copper and/or cobalt and/or tungsten at the bottom of the via to be created, a thin etch-stop layer is usually deposited on the copper and/or cobalt and/or tungsten (i.e. on the copper and/or cobalt and/or tungsten metal's surface). This thin etch-stop layer often comprises or consists of one or more aluminium compounds and can have a thickness of 30 nm or below, in particular of 20 nm or below, more in particular of 10 nm or below or even of 5 nm or below. Such etch-stop layer is often referred to as an "ESL" ("etch stop layer" for dry etch processing).

In order to proceed with the manufacturing process, the following materials have to be removed: 1) the metal-containing hard mask (e.g. the TiN hard mask), 2) any polymeric residues still in the via; and 3) the etch-stop layer. This threefold removal of material can be achieved by either a 1-step process or a 2-step process. In both alternatives of the threefold removal process it is critical that certain other materials which are also present on the semiconductor substrate are not or only to the least possible extent etched, damaged or removed so that they are preserved to the highest possible extent. Such other materials to be preserved in the threefold removal process comprise the low-k material, copper, cobalt and also tungsten, which may be present under a layer of low-k material and/or under an etch-stop layer comprising or consisting of one or more aluminium compounds (as explained above).

In said 1-step process all of said three removal steps are performed simultaneously by applying a suitable composition which usually comprises one or more oxidants, e.g. hydrogen peroxide.

In said 2-step process, in a first step, the metal-containing hard mask (e.g. the TiN hard mask) is removed, usually together with residues from previous production steps, e.g. polymeric residues, by applying a composition which usually comprises an oxidant like hydrogen peroxide. Said composition should not damage the layer of low-k material or the etch-stop layer, specifically the etch-stop layer comprising or consisting of an aluminium compound. In the second step, the etch-stop layer is to be removed by applying a suitable composition. Typically, in this second step the polymeric residues still in the via are also removed (see above).

The composition to be used in the 1-step process as explained above should selectively remove the metal-containing hard mask, typically comprising or consisting of TiN, the etch-stop layer, specifically the etch-stop layer comprising or consisting of one or more aluminium compounds, and any polymeric residues still in the via, while not—or only to the least possible extent—damaging any present layer of low-k material, any present coper and/or any present cobalt and preferably any present tungsten.

For this purpose, the composition to be used in said 1-step process needs to have inter alia properties which allow a very controlled and specific etching of layers comprising or consisting of an aluminium compound, even of thin or ultra-thin layers comprising or consisting of an aluminium compound, while not compromising layers of low-k materials, copper metal and/or cobalt metal, which may also be present.

A specific additional requirement occurring in manufacturing processes for sub-7 nm structures, in particular for 5 nm structures, on a semiconductor substrate is, that any tungsten metal or tungsten material present, even when present under a layer of low-k material and/or under an etch-stop layer comprising or consisting of one or more aluminium compounds, should neither be etched, damaged or removed in said threefold removal process. It has been found that compositions previously used to perform said threefold removal process, in particular in a 1-step process (as explained above) were not suited to sufficiently preserve in said threefold removal process any tungsten metal or tungsten material, even when said tungsten metal or tungsten material was (only) present under a layer of low-k material and/or under an etch-stop layer comprising or consisting of one or more aluminium compounds. It has been assumed in this context that compositions previously used to perform said threefold removal process in a 1-step process could penetrate or diffuse through pores or capillaries which are present in the layers overlying the tungsten metal or tungsten material, i.e. layers of low-k material and (usually also) etch-stop layers comprising one or more aluminium compounds.

The compositions according to the present invention as defined in this text are particularly suited for application in a 1-step (threefold removal) process, specifically in manufacturing processes for 10 nm structures, preferably for sub-10 nm structures (where the term "sub-10 nm structures" here and throughout this text refers to and comprises structures which are smaller than 10 nm, e.g. 7 nm structures and/or 5 nm structures), more preferably for 7 nm structures. Preferred compositions according to the present invention as defined in this text are even suited for application in a 1-step (threefold removal) process, specifically in manufacturing processes for sub-7 nm structures, in particular for 5 nm structures, on a semiconductor substrate.

It has been known that dielectric films of aluminium oxide can generally be removed by wet etching in acidic and basic media (see e.g. B. Zhou et al., J. Electrochem. Soc. Vol. 143 (2) 619-623 (1996) or J. Oh et al. J. Electrochem. Soc. Vol. 156 (4) D217-D222 (2011)), however, not with the etch-rate precision and reliability required for etching thin or ultra-thin etch-stop layers comprising or consisting of an aluminium compound, e.g. aluminium oxide.

Document US 2018/0148669 A1 deals with cleaning compositions for removing post etch residue.

Document U.S. Pat. No. 9,546,321 B2 describes compositions and methods for selectively etching titanium nitride.

Document WO 2008/080097 A2 discusses liquid cleaner for the removal of post-etch residues.

Document WO 2019/110690 A2 (a document published after the earliest filing date of the present patent application) deals with a composition and process for selectively etching a layer comprising an aluminium compound in the presence of layers of low-k materials, copper and/or cobalt.

Document WO 03/035797 A1 is related to an aqueous cleaning composition containing copper-specific corrosion inhibitor for cleaning inorganic residues on a semiconductor substrate.

Document WO 2004/030038 A2 is related to compositions substrate for removing etching residue and use thereof.

Document WO 2009/064336 A1 teaches compositions for removal of metal-containing hard mask etching residues from a semiconductor substrate.

Document WO 2012/009639 A2 is related to an aqueous cleaner for the removal of post-etch residues.

Document WO 2014/197808 A1 describes compositions and methods for selectively etching titanium nitride.

Document US 2004/061092 is related to a wet etch for selective removal of alumina.

Document US 2010/0075478 is related to a method for pattern resist removal.

Document US 2012/0052686 is related to a cleaning solution and damascene processing using the same.

It was thus a primary object of the present invention to provide a composition useful for removing post-etch or post-ash residues from the surface of a semiconductor substrate and to provide a composition useful for selectively etching or partially etching of a layer or hard mask and/or a layer comprising or consisting of one or more aluminium compounds, in the presence of a low-k material and one or more materials selected from the group consisting of copper, cobalt and tungsten, on the surface of a semiconductor substrate. Said composition should at the same time not or not significantly compromise low-k materials and one or more materials selected from the group consisting of copper, cobalt and tungsten, which are also present. This composition should in particular be suited for use in a manufacturing process for creating 7 nm structures and/or sub-7 nm structures (ideally including 5 nm structures) on a semiconductor substrate.

It was another object of the present invention to provide a process for manufacturing a semiconductor device wherein post-etch or post-ash residues are removed from the surface of a semiconductor substrate and/or wherein a layer or hard mask is selectively etched on the surface of a semiconductor substrate and/or a layer comprising or consisting of one or more aluminium compounds is selectively etched on the surface of a semiconductor substrate, in the presence of a low-k material and one or more materials selected from the group consisting of copper, cobalt and tungsten.

Further objects of the present invention are disclosed in or become apparent from the present description and the accompanying claims.

It has now been found that the primary object and other objects of the invention are accomplished by the use of a cleaning composition comprising (i.e. one or more further substances may be present) at least the following components:

(A) as solubilizer, one or more compounds of formula I:

(I)

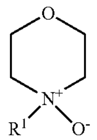

wherein $R^1$ is selected from the group consisting of branched or unbranched (preferably unbranched) alkyl having 1, 2, 3 or 4 carbon atoms;

(B) one or more corrosion inhibitors, selected from the group consisting of benzotriazoles which are unsubstituted or substituted once or twice independently by branched or unbranched alkyl having 1, 2, 3 or 4 carbon atoms, aminoalkyl wherein the alkyl is branched or unbranched and has 1, 2, 3 or 4 carbon atoms, phenyl, thiophenyl, halogen, hydroxy, nitro and/or thiol, and mixtures thereof;

(C) one or more polar, non-protogenic organic solvents, wherein preferably the one, or at least one of the more, or all of the more, polar, non-protogenic organic solvents (C) is (are) selected from the group consisting of an alkyl sulfone compound of formula IV:

(IV)

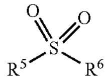

wherein $R^5$ is a branched (where structurally possible) or unbranched alkyl group having 1 to 5, preferably 1 to 4, carbon atoms, $R^6$ is a branched (where structurally possible) or unbranched alkyl group having 1 to 5, preferably 1 to 4, carbon atoms, or $R^5$ and $R^6$ together form a branched (where structurally possible) or unbranched alkylen group having 3 to 5, preferably 3 to 4, carbon atoms, wherein one or two carbon atoms of said alkylen group can independently be substituted by —O—$R^7$ (i.e. any groups —O—$R^7$ are bonded in each case to a carbon atom of said alkylen group and substitute an otherwise present hydrogen atom), wherein $R^7$ is a branched (where structurally possible) or unbranched alkyl group having 1 to 4, preferably 1 to 2, carbon atoms;

dimethyl formamide, dimethyl sulfoxide, dimethyl acetamide,

N-methylpyrrolidone, propylene carbonate, tetrahydrofuran, 2-imidazolidinone which is substituted once or twice by a branched (where structurally possible) or unbranched alkyl group having 1 to 4, preferably 1 to 2, carbon atoms; preferably 1,3-dimethyl-2-imidazolidinone and mixtures thereof wherein more preferably the one, or at least one of the more, or all of the more, polar, non-protogenic organic solvents (C) is (are) selected from the group consisting of an alkyl sulfone compound of formula IV as defined above; dimethyl sulfoxide; dimethyl acetamide; N-methylpyrrolidone, propylene carbonate; 2-imidazolidinone which is substituted once or twice by a branched or unbranched alkyl group having 1 to 4, preferably 1 to 2, carbon atoms, preferably 1,3-dimethyl-2-imidazolidinone; and mixtures thereof;

wherein even more preferably the one, or at least one of the more, or all of the more, polar, non-protogenic organic solvents (C) is (are) selected from the group consisting of an alkyl sulfone compound of formula IV as defined above; dimethyl sulfoxide; dimethyl acetamide; N-methylpyrrolidone; and mixtures thereof and (D) water, in combination with one or more oxidants, wherein preferably the one or more oxidants are selected from the group consisting of hydrogen peroxide, peroxide urea, peroxydisulfuric acid, ammonium persulfate, peroxymonosulfuric acid, pyrosulfuric acid, ozone and mixtures thereof, for removing post-etch or post-ash residue from the surface of a semiconductor substrate and/or for etching, preferably oxidative etching, or partially etching, preferably partially oxidative etching, of a layer or mask, preferably a hard mask, comprising or consisting of a material selected from the group consisting of Ti, TiN, Ta, TaN, Al and $HfO_x$ and/or a layer or mask comprising or consisting of a material selected from the group consisting of tungsten carbide ($WC_x$) and tungsten nitride ($WN_x$), wherein preferably the material comprises or is TiN, preferably on the surface of a semiconductor substrate.

It was particularly surprising that the cleaning composition in combination with one or more oxidants is suited for the use on a semiconductor substrate and allows a very controlled and specific etching of a layer or hardmask comprising or consisting of a material selected from the group consisting of Ti, TiN, Ta, TaN, Al and $HfO_x$ and/or a layer or hardmask comprising or consisting of a material selected from the group consisting of tungsten carbide ($WC_x$) and tungsten nitride ($WN_x$), and a very controlled and specific etching of a layer comprising or consisting of one or more aluminium compounds, even of thin or ultra-thin layers comprising or consisting of an aluminium compound, while at the same time not or not significantly compromising layers of any present low-k materials, of any present copper and/or of any present cobalt.

The cleaning composition in combination with one or more oxidants as defined above is therefore particularly suited for use in a manufacturing process for creating 10 nm structures or sub-10 nm structures (as defined above), in particular 7 nm structures, including a threefold removal of hard mask, etch-stop layer and polymeric residues (as explained above) in one step, on a semiconductor substrate.

A preferred cleaning composition in combination with one or more oxidants as defined above and in this text is even suited for application in a manufacturing process for sub-7 nm structures, in particular for 5 nm structures, including a threefold removal of hard mask, etch-stop layer and polymeric residues (as explained above) in one step, on a semiconductor substrate.

The invention as well as preferred embodiments and preferred combinations of parameters, properties and elements thereof are defined in the appended claims. Preferred aspects, details, modifications and advantages of the present invention are also defined and explained in the following description and in the examples stated below.

In the context of the present invention, "one or more aluminium compounds" of a layer comprising or consisting of one or more aluminium compounds comprise one or more compounds selected from the group consisting of aluminium oxides ("$AlO_x$", "$AlO_xN_yF_z$", wherein the indices "x", "y" and "z" stand for numbers indicating stoichiometric or non-stoichiometric amounts of the respective chemical element), aluminium nitride, aluminium oxynitride ("AlON") and aluminium carbooxynitride ("AlCNO"). Preferably, an aluminium compound also comprises fluorine. The exact composition of an aluminium compound and the exact contents or ratios of the elements aluminium, oxygen, nitrogen, carbon and/or fluorine present in an aluminium compound of the one or more aluminium compounds as defined herein can vary, e.g. depending on the kind of pre-treatment of a semiconductor substrate comprising said aluminium compound.

An "etch-stop layer" as referred to in the present text is—consistent with the usual meaning in the field—a layer of a material that is not etched under the conditions applied in usual etching processes for structuring the surface of a semiconductor substrate (e.g. a microelectronic device), in particular a semiconductor wafer, and which covers and thereby protects subjacent materials which are potentially sensitive to said etching processes, e.g. copper (e.g. in copper interconnects) or other metals, from undesired attacks of the etching agents applied. After the etching process, the etch-stop layer can be removed under conditions specific to the material of the etch-stop layer which removal also will (if desired) not negatively affect the subjacent materials.

In the context of the present invention, a "low-k material" preferably is a material with a dielectric constant $\kappa<3.9$ and/or (preferably "and")

is selected from the group consisting of (i) silicon-containing materials, preferably selected from the group consisting of $SiO_2$, silicon oxycarbide (SiOC), tetraethylorthosilicate (TEOS), boron-doped phosphosilicate glass (BPSG), fluorine-doped silicon dioxide (fluorosilicate glass, FSG), carbon-doped silicon dioxide, organo silicate glass (OSG), carbon-doped oxide (CDO), porous silicon dioxide, porous carbon-doped silicon-dioxide and spin-on silicon polymeric materials, preferably hydrogen silsesquioxane (HSQ) and methylsilsesquioxane (MSQ); preferably organic siloxanes (i.e. siloxanes comprising carbon-silicon bonds); and preferably organic silanes (i.e. silanes comprising carbon-silicon bonds) and (ii) polymeric materials, preferably selected from the group consisting of spin-on organic polymeric dielectrics, preferably comprising polyimide (PI); polynorbornenes; benzocyclobutene and polytetrafluorethylene (PTFE).

In the cleaning composition for use according to the present invention as defined above, the one or more solubilizers (A), the one or more corrosion inhibitors (B) and the one or more polar, non-protogenic organic solvents (C) generally can in each case be used alone (as one single compound) or can be used in combination with other compounds of the same type (solubilizer, corrosion inhibitor or polar, non-protogenic organic solvent, respectively, as applicable).

In the context of the present invention, a "non-protogenic" solvent preferably means a solvent which is not capable of acting as a proton donor, preferably relative to water (of pH 7).

In the cleaning composition for the use according to the present invention as defined above, $R^1$ in the compound of formula I in the one or more solubilizers of component (A) specifically comprises methyl, ethyl and branched and unbranched propyl and butyl. Preferably, $R^1$ is methyl. 4-methylmorpholine-4-oxide (also referred to as "4-MM-4-O" or "NMMO" in this text and also known as N-methylmorpholine-N-oxide, CAS RN 7529-22-8) is a particularly preferred compound of formula I for use in the cleaning composition as defined above. The present definition of the compound of formula I includes hydrates, specifically the monohydrate of 4-methylmorpholine-4-oxide (CAS RN 70187-32-5) and isomers and tautomers of compounds of formula I.

In the cleaning composition for the use according to the present invention as defined above, where component (B) comprises one or more corrosion inhibitors selected from the group consisting of benzotriazoles which are unsubstituted or substituted (as defined above), this definition comprises one such benzotriazole and a plurality of such benzotriazoles which can independently be unsubstituted or substituted as defined above, and includes mixtures of such benzotriazoles.

Where component (B) comprises benzotriazole which is substituted once or twice independently by branched or unbranched alkyl having 1, 2, 3 or 4 carbon atoms, this definition specifically comprises methyl, ethyl and branched and unbranched propyl and butyl. Methyl is preferred for the purposes of the present invention. Specific benzotriazoles which are comprised by the present definition are 5-methylbenzotriazole and 6-methylbenzotriazole (for applicable nomenclature see below). Where component (B) comprises benzotriazole which is substituted by aminoalkyl wherein the alkyl is branched or unbranched and has 1, 2, 3 or 4 carbon atoms, 2-(5-amino-pentyl) is preferred for the purposes of the present invention.

Where component (B) comprises benzotriazole which is substituted once or twice independently by halogen, said halogen is selected from fluorine, chlorine, bromine and iodine, preferably from chlorine and bromine. Benzotriazole substituted by chlorine, preferably substituted once by chlorine, is preferred as benzotriazole which is substituted once or twice independently by halogen.

As is known in the technical field, in benzotriazoles the bond between positions (i.e. ring nitrogen atoms) 1 and 2 and the bond between positions (i.e. ring nitrogen atoms) 2 and 3 have proved to have the same bond properties. The proton attached to one nitrogen atom in the nitrogen-containing ring of the benzotriazole structure does not tightly bind to any of the three ring nitrogen atoms present but rather migrates rapidly between positions 1 and 3, thus creating tautomers. For the purposes of the present invention, the name "5-methyl-2H-benzotriazole" as used above therefore comprises this compound and all tautomers thereof, specifically the compounds known as "5-methyl-benzotriazole", "6-methyl-benzotriazole" (CAS RN 49636-02-4), "6-methyl-1H-benzo[d][1.2.3]triazole", "5-methyl-1H-benzo[d][1.2.3]triazole" and "5-methyl-2H-benzo[d][1.2.3]triazole". And vice versa a compound referred to in the present text as "5-methyl-2H-benzotriazole", "5-methyl-benzotriazole", "6-methyl-benzotriazole", "6-methyl-1H-benzo[d][1.2.3]triazole", "5-methyl-1H-benzo[d][1.2.3]triazole", "5-methyl-2H-benzo[d][1.2.3]triazole", "5-Me-BTA" or "6-Me-BTA" in each case has the same meaning as the compound "5-methyl-2H-benzotriazole and all of its tautomers".

Correspondingly, for the purposes of the present invention, the name "5-chloro-2H-benzotriazole" as used in the present text comprises this compound and all tautomers thereof, specifically the compounds known as "5-chloro-benzotriazole" (CAS RN 94-97-3), "6-chloro-benzotriazole", "6-chloro-1H-benzo[d][1.2.3]triazole", "5-chloro-1H-benzo[d][1.2.3]-triazole" and "5-chloro-2H-benzo[d][1.2.3] triazole". And vice versa a compound referred to in the present text as "5-chloro-2H-benzotriazole", "5-chloro-benzotriazole", "6-chloro-benzotriazole", "6-chloro-1H-benzo [d][1.2.3]triazole", "5-chloro-1H-benzo[d][1.2.3]triazole", "5-chloro-2H-benzo[d][1.2.3]triazole", "5-Cl-BTA" or "6-Cl-BTA" in each case has the same meaning as the compound "5-chloro-2H-benzotriazole and all of its tautomers". This definition applies mutatis mutandis to other benzotriazoles, in particular substituted benzotriazoles, as defined or mentioned in the present text.

Benzotriazole which is unsubstituted or substituted once or twice, preferably once, independently by branched or unbranched alkyl having 1, 2, 3 or 4 carbon atoms, preferably methyl, and/or (preferably "or") by halogen, or mixtures thereof, is preferred as component (B). In a particularly preferred variant of the present invention, component (B) is selected from the group consisting of unsubstituted benzotriazole (BTA), 5-methyl-2H-benzotriazole, 5-chloro-2H-benzotriazole and mixtures thereof.

A use of a cleaning composition in combination with one or more oxidants according to the invention as defined herein (or a use of a cleaning composition in combination with one or more oxidants according to the invention as described above or below as being preferred) is preferred wherein the one, or at least one of the more, or all of the more, polar, non-protogenic organic solvents (C) is (are) an alkyl sulfone compound (alkyl sulfone compounds) of formula IV as defined above.

In the context of the present invention, the alkyl sulfone compound of formula IV preferably is selected from the group consisting of ethyl methyl sulfone, ethyl isopropyl sulfone, ethyl isobutyl sulfone, isopropyl isobutyl sulfone, sulfolane, 3-methoxy sulfolane and mixtures thereof. More preferably, the alkyl sulfone compound of formula IV is selected from the group consisting of ethyl methyl sulfone, ethyl isopropyl sulfone, sulfolane and mixtures thereof. In a particularly preferred variant of the present invention, the alkyl sulfone compound of formula IV comprises or is sulfolane.

In the context of the present invention, an "alkylen group" preferably means a divalent chain of carbon atoms. Examples for an "alkylen group" as used herein comprise "methylene" ($R^a—CH_2—R^b$), "ethylene" ($R^a—CH_2—CH_2—R^b$), "trimethylene" ($R^a—CH_2—CH_2—CH_2—R^b$) and "propylene" ($H_3C—C(R^a)H—CH_2—$).

It has been found in own experiments that a cleaning composition according to the present invention as defined above, in particular a cleaning composition wherein the one, or at least one of the more, or (in a particularly preferred variant of this aspect of the present invention) all of the more, polar non-protogenic organic solvents (C) is (are) an alkyl sulfone compound (alkyl sulfone compounds) of formula IV (or an alkyl sulfone compound of formula IV which is described herein as preferred), when used in combination with one or more oxidants according to the invention as defined herein (or in combination with one or more oxidants according to the invention as described above or below as being preferred) shows the following beneficial effects:

a high selectivity for etching (in particular oxidative etching, or partially etching, in particular partially oxidative etching) of a layer or mask, comprising or consisting of a material selected from the group consisting of Ti, TiN, Ta, TaN, Al and $HfO_x$ and/or a layer or mask comprising or consisting of a material selected from the group consisting of tungsten carbide ($WC_x$) and tungsten nitride ($WN_x$), in particular comprising or consisting of TiN, in particular in the presence of at least one material selected from the group consisting of copper, cobalt, preferably tungsten, and a low-k material, on the surface of a semiconductor substrate;

and a high stability of said cleaning composition towards one or more oxidants, in particular towards oxidants comprising peroxide, more in particular towards hydrogen peroxide. Said high stability towards one or more oxidants results in a long-lasting and high (selective) activity of etching of a layer or mask, comprising or consisting of a material selected from the group consisting of Ti, TiN, Ta, TaN, Al and $HfO_x$, and/or a layer or mask comprising or consisting of a material selected from the group consisting of tungsten carbide ($WC_x$) and tungsten nitride ($WN_x$), in particular comprising or consisting of TiN (as specified above), of said cleaning composition, when used in combination with one or more oxidants (as specified above). For example, said cleaning composition, when used in combination with one or more oxidants (in particular with hydrogen peroxide) can preserve its high and selective activity of etching of a layer or mask comprising or consisting of TiN, for an extended period of 24 hours or more.

In certain cases, a use of a cleaning composition in combination with one or more oxidants according to the invention as defined herein (or a use of a cleaning composition in combination with one or more oxidants according to the invention as described above or below as being preferred) is also preferred wherein the cleaning composition comprises as further component:

(E) one or more alkyl glycol ethers.

It has been found in own experiments that a cleaning composition as defined above, comprising in addition component (E) as defined above, in combination with one or more oxidants, is not only suited for use in a manufacturing process for creating 7 nm structures on a semiconductor substrate but is even suited for use in a manufacturing process for creating sub-7 nm structures, preferably of 5 nm structures, on a semiconductor substrate. This particularly beneficial usefulness of the cleaning composition comprising in addition component (E) (preferably the preferred components (E) as defined in this text and/or in the amounts or preferred amounts as defined in the present text), in combination with one or more oxidants, is due to its ability of preserving in a threefold removal process (as explained above), preferably in a threefold removal process performed as 1-step process (as explained above) tungsten (preferably a tungsten metal and/or a tungsten material) which may be present under a layer of low-k material or under a layer of low-k material and an etch-stop layer comprising or consisting of one or more aluminium compounds.

It has been found in own experiments that compositions previously used to perform said threefold removal process (not comprising component (E) as defined above), in particular in a 1-step process (as explained above), were not suited to sufficiently preserve in said threefold removal process any tungsten metal or tungsten material present under a layer of low-k material or under a layer of low-k material and an etch-stop layer comprising or consisting of one or more aluminium compounds. It was also found in own experiments that compositions previously used to perform said threefold removal process and not comprising component (E) could unintentionally damage or at least partially etch tungsten (or tungsten metal and/or a tungsten material) that was present during said threefold removal process under a layer of low-k material or under a layer of low-k material and an etch-stop layer comprising or consisting of one or more aluminium compounds, to a significant extent. Own experiments also led to the conclusion that this damaging or partial etching of tungsten under a layer of low-k material or under a layer of low-k material and an etch-stop layer comprising or consisting of one or more aluminium compounds occurred, because compositions not comprising component (E) as defined above could penetrate or diffuse through a layer of low-k material or through a layer of low-k material and an etch-stop layer comprising or consisting of one or more aluminium compounds which were overlying the tungsten (or tungsten metal and/or a tungsten material), in an amount sufficient to unintentionally damage or partially etch the subjacent tungsten.

A further finding from own experiments indicates that the beneficial properties of a cleaning composition to be used in combination with one or more oxidants according to the present invention as defined above to preserve tungsten (as tungsten metal or as a tungsten material) in a process and/or in a manner as explained above from being damaged, removed or partially etched can be optimized by selecting certain preferred alkyl glycol ethers (as defined and explained below) as component (E) of the cleaning composition (as defined above) and/or by using said preferred alkyl glycol ethers in said cleaning compositions in the amounts or preferred amounts as defined and explained below.

A use of a cleaning composition in combination with one or more oxidants according to the invention as defined herein (or a use of a cleaning composition in combination with one or more oxidants according to the invention as described above or below as being preferred) is therefore preferred wherein component (E) is selected from the group consisting of alkyl glycol ethers having a Hansen Polar Solubility Parameter $\delta_p$ of $\leq 8\ (MPa)^{1/2}$, preferably of $\leq 7.6\ (MPa)^{1/2}$ and/or the cleaning composition comprises as component (E) one or more alkyl glycol ethers of formula II $$H\left[O-R^2\right]_n O-R^3, \qquad (II)$$

wherein $R^2$ is a branched or unbranched (preferably an unbranched) alkylen group having 1 to 6, preferably 2 to 4, carbon atoms, $R^3$ is a branched or unbranched (preferably an unbranched) alkyl group having 1 to 8, preferably 1 to 6, carbon atoms and n is an integer in the range of from 1 to 6, preferably of from 2 to 6.

It has been found in own experiments that the alkyl glycol ethers as defined above and the preferred alkyl glycol ethers as defined below have properties (e.g. in terms of hydrophobicity and/or viscosity) which make them excellently suited for use in cleaning compositions for the use according to the present invention in combination with one or more oxidants.

For the purposes of the present invention, a "Hansen Polar Solubility Parameter $\delta_p$" for alkyl glycol ethers of component (E) as defined above is preferably a respective parameter as determined in the product data sheets for respective compounds by company Dow, which can be accessed on the Internet at the addresses:

https://www.dow.com/en-us/product-search/eseriewlycolethers and https://www.dow.com/en-us/product-search/pseriewlycolethers.

Hansen Polar Solubility Parameters $\delta_p$ for compounds not found at the above addresses are preferably determined for the purposes of the present invention according to the method defined in C. Hansen, "Hansen Solubility Parameters: A User's Handbook", 2nd ed. 2007 (ISBN 9780849372483), in particular on p. 15-16.

Hansen solubility parameters were developed by Charles M. Hansen in his Ph.D. thesis in 1967 as a way of predicting if one material will dissolve in another and form a solution They are based on the idea that like dissolves like where one molecule is defined as being "like" another if it bonds to itself in a similar way. Specifically, each molecule is given three Hansen parameters, each generally measured in $(MPa)^{1/2}$:

$\delta_d$: The energy from dispersion forces between molecules $\delta_p$: The energy from dipolar intermolecular force between molecules (referred to as "Hansen Polar Solubility Parameter" in the present text)

$\delta_h$: The energy from hydrogen bonds between molecules.

These three parameters can be regarded as co-ordinates for a point in three dimensions also known as the Hansen space. The nearer two molecules are in this three-dimensional space, the more likely they are to dissolve into each other.

In the cleaning composition for use according to the present invention as defined above, the one or more alkyl glycol ethers (E) generally can in each case be used alone (as one single compound) or can be used in combination with other alkyl glycol ethers (E).

It has also been found in own experiments that a cleaning composition according to the present invention comprising one or more alkyl glycol ethers (E), as defined above, and comprising as one, or at least as one of the more, or as all of the more, polar non-protogenic organic solvents (C) 2-imidazolidinone which is substituted once or twice by a branched or unbranched alkyl group having 1 to 4, preferably 1 to 2, carbon atoms, in particular 1,3-dimethyl-2-imidazolidinone, shows particularly good stability when used in combination with one or more oxidants according to the invention as defined herein (or in combination with one or more oxidants according to the invention as described above or below as being preferred). Said particularly good stability (towards one or more oxidants, in particular towards hydrogen peroxide) results in a longer-lasting and higher (selective) activity of etching of a layer or mask, comprising or consisting of a material selected from the group consisting of Ti, TiN, Ta, TaN, Al and HfOx and/or a layer or mask comprising or consisting of a material selected from the group consisting of tungsten carbide ($WC_x$) and tungsten nitride ($WN_x$), in particular comprising or consisting of TiN (as specified above), of said cleaning composition, than the use of a similar cleaning composition comprising one or more alkyl glycol ethers (E), but not comprising a 2-imidazolidinone (as defined above) as polar non-protogenic organic solvent (C).

A use of a cleaning composition in combination with one or more oxidants according to the invention as defined herein (or a use of a cleaning composition in combination with one or more oxidants according to the invention as described above or below as being preferred, in particular a use of a cleaning composition in combination with one or more oxidants according to the invention as specified below as "one preferred specific variant of the present invention") is therefore preferred wherein the cleaning composition comprises:

(C) one or more polar, non-protogenic organic solvents, wherein the one, or at least one of the more, or all of the more, polar, non-protogenic organic solvents (C) is (are) 2-imidazolidinone which is substituted once or twice by a branched or unbranched alkyl group having 1 to 4, preferably 1 to 2, carbon atoms, preferably 1,3-dimethyl-2-imidazolidinone and (E) one or more alkyl glycol ethers (as defined herein, or as defined herein as being preferred).

A cleaning composition for use in combination with one or more oxidants according to the invention as defined herein (or a use of a cleaning composition in combination with one or more oxidants according to the invention as described above or below as being preferred) wherein the one, or at least one of the more, or all of the more, polar, non-protogenic organic solvents (C) is (are) an alkyl sulfone compound (alkyl sulfone compounds) of formula IV (or an alkyl sulfone compound of formula IV which is described herein as preferred), may comprise as further component (E), one or more alkyl glycol ethers or it may not comprise such further component (E). In many cases, a cleaning composition for use in combination with one or more oxidants according to the invention as defined herein (or a use of a cleaning composition in combination with one or more oxidants according to the invention as described above or below as being preferred), wherein the one, or at least one of the more, or all of the more, polar, non-protogenic organic solvents (C) is (are) an alkyl sulfone compound (alkyl sulfone compounds) of formula IV (or an alkyl sulfone compound of formula IV which is described herein as preferred) is preferred, which does not comprise as further component (E), one or more alkyl glycol ethers (as defined above).

A use of a cleaning composition in combination with one or more oxidants according to the invention as defined herein (or a use of a cleaning composition in combination with one or more oxidants according to the invention as described above or below as being preferred) is also preferred wherein the cleaning composition further comprises:

(F) a buffering system which is suitable to buffer the pH of the cleaning composition in the range of from 6 to 9, preferably of from 7 to 8.5;

and/or (G) one or more chelating agents, preferably selected from the group consisting of 1,2-cyclohexylenedinitrilotetraacetic acid; N,N,N,N-ethylenediaminetetrakis(methylenephosphonic acid); ethylenediaminetetraacetic acid; 2,2,6,6-tetramethyl-3,5-heptanedione; 1,1,1-trifluoro-2,4-pentanedione; 1,1,1,5,5,5-hexafluoro-2,4-pentanedione; 1,4-benzoquinone; tetrachloro-1,4-benzoquinone; 8-hydroxyquinoline; hydroxyquinoline sulfonic acid; 2-(2-hydroxyphenyl)-benzoxazol; 2-(2-hydroxyphenyl)-benzothiazole; pyridine; 2-ethylpyridine; 2-methoxypyridine; 3-methoxypyridine; 2-picoline; dimethylpyridine; piperidine; piperazine; pyrrole; isoxazole; bipyridine; pyrimidine; pyrazine; pyridazine; quinoline, isoquinoline; indole; 1-methylimidazole; aniline; salicylidene aniline; methylamine; dimethylamine; ethylamine; triethylamine; isobutylamine; diisobutylamine, tert-butylamine; tributylamine; dipropylamine; diglycol amine; diisopropylamine; pentamethyldiethylenetriamine; monoethanolamine; triethanolamine; methyldiethanolamine; acetylacetonate; acetylacetone; 2,2'-azanediyldiacetic acid;

ammonium carbamate; ammonium pyrrolidinedithiocarbamate; dimethyl malonate; methyl acetoacetate; acetoacetamide; N-methyl acetoacetamide; tetramethylammonium thiobenzoate; etramethylthiuram disulfide; etidronic acid; formic acid; lactic acid; ammonium lactate; methanesulfonic acid; propionic acid; sulfosalicylic acid; salicylic acid; gamma-butyrolactone; and mixtures thereof, wherein preferably the one or more chelating agents are selected from the group consisting of 1,2-cyclohexylenedinitrilotetraacetic acid; N,N,N,N-ethylenediaminetetrakis(methylenephosphonic acid) and mixtures thereof;

preferably in a total amount in the range of from 0.01 mass-% to 3 mass-%, more preferably in the range of from 0.1 mass-% to 2 mass-% and yet more preferably in the range of from 0.15 mass-% to 1.5 mass-%, relative to the total mass of the cleaning composition;

and/or (H) one or more surfactants, preferably comprising one or more fluorosurfactants (as defined below).

A use of a cleaning composition in combination with one or more oxidants according to the invention as defined herein (or a use of a cleaning composition in combination with one or more oxidants according to the invention as described above or below as being preferred) is therefore also preferred wherein the cleaning composition has a pH in the range of from 6 to 9, preferably of from 7 to 8.5.

A use of a cleaning composition in combination with one or more oxidants according to the invention is preferred wherein the buffering system of component (F) is a combination of weak acid (e.g. phosphoric acid) and salt of a weak acid, as is known in the art. The buffering system may comprise as acidic elements (weak acid) compounds which are also chelating agents (G), in particular 1,2-cyclohexylenedinitrilotetraacetic acid and/or N,N,N,N-ethylenediaminetetrakis(methylenephosphonic acid). Preferred salts of a weak acid of the buffering system comprise ammonium compounds of formula III $$[N(R^4)_4]OH \quad (III),$$

wherein $R^4$ is independently selected from hydrogen and a branched or unbranched alkyl group having 1 to 6, preferably 1 to 4, carbon atoms. For the purposes of the present invention, tetraethyl ammonium hydroxide and tetramethyl ammonium hydroxide are preferred compounds of formula III.

In the cleaning composition for use according to the present invention as defined above, the one or more chelating agents (G) generally can in each case be used alone (as one single compound) or can be used in combination with other chelating agents (G).

A use of a cleaning composition in combination with one or more oxidants according to the invention is also preferred wherein the one or more surfactants (H) of the cleaning composition as defined above (if present) are selected from the group consisting of:

(i) anionic surfactants, preferably selected from the group consisting of ammonium lauryl sulfate, fluorosurfactants, preferably selected from the group consisting of perfluorinated alkylsulfonamide salts (preferably perfluorinated, N-substituted alkylsulfonamide ammonium salts, PNAAS), perfluorooctanesulfonate, perfluorobutanesulfonate, perfluorononanoate and perfluorooctanoate; alkyl-aryl ether phosphates and alkyl ether phosphates, (ii) zwitterionic surfactants, preferably selected from the group consisting of (3-[(3-cholamidopropyl)dimethylammonio]-1-propanesulfonate) ("CHAPS"), cocamidopropyl hydroxysultaine (CAS RN 68139-30-0), {[3-(dodecanoylamino)propyl](dimethyl)ammonio}acetate, phosphatidylserine, phosphatidylethanolamine, phosphatidylcholine and (iii) non-ionic surfactants, preferably selected from the group consisting of glucoside alkyl ethers, glycerol alkyl ethers, cocamide ethanolamines and lauryldimethylaminoxide.

More preferred surfactants (H) in compositions according to the or a first preferred variant of the invention are or comprise perfluorinated, N-substituted alkylsulfonamide ammonium salts. Preferred surfactants (H) in compositions according to the invention do not comprise metals or metal ions.

In the cleaning composition for use according to the present invention as defined above, the one or more surfactants (H) generally can in each case be used alone (as one single compound) or can be used in combination with other surfactants (H).

A use of a cleaning composition in combination with one or more oxidants according to the invention is also preferred wherein the one or more surfactants (H) of the cleaning composition as defined above (if present) are present in a total amount in the range of from 0.01 mass-% to 2 mass-%, more preferably in the range of from 0.02 mass-% to 1 mass-% and yet more preferably in the range of from 0.025 mass-% to 0.5 mass-%, relative to the total mass of the cleaning composition.

Preferred is also a use of a cleaning composition in combination with one or more oxidants according to the invention as defined herein (or a use of a cleaning composition in combination with one or more oxidants according to the invention as described above or below as being preferred) wherein in the cleaning composition the one or at least one of the more solubilizers (A) is or comprises 4-methylmorpholine-4-oxide, and/or the one or at least one of the more corrosion inhibitors (B) is selected from the group consisting of benzotriazoles which are unsubstituted or substituted once or twice independently by branched or unbranched alkyl having 1, 2, 3 or 4 carbon atoms and/or by halogen, preferably selected from the group consisting of chlorine and bromine, and mixtures thereof;

and/or the one or at least one of the more polar, non-protogenic organic solvents (C) is selected from the group consisting of dimethyl formamide, dimethyl sulfoxide, dimethyl acetamide, N-methylpyrrolidone, propylene carbonate, sulfolane (2,3,4,5-tetrahydrothiophene-1,1-dioxide), tetrahydrofuran and mixtures thereof, wherein preferably the one or at least one of the more polar, non-protogenic organic solvents (C) is dimethyl sulfoxide or sulfolane, and/or the total amount of etchants comprising fluoride anions is $<0.001$ mass-%, relative to the total mass of the cleaning composition, wherein preferably the cleaning composition does not comprise etchants comprising fluoride anions;

and/or component (E) comprises one or more alkyl glycol ethers of formula II and in the one or more alkyl glycol ethers of formula II, $R^2$ is a branched or unbranched alkylen group having 3 to 4 carbon atoms;

and/or $R^3$ is a branched or unbranched alkyl group having 1, 2, 3, 5 or 6 carbon atoms;

and/or n is an integer in the range of from 2 to 4;

and/or the specific compound butyl diglycol (also known as “diethylene glycol butyl ether”) is not comprised.

The etchants comprising fluoride anions whose total amount, relative to the total mass of the cleaning composition, is <0.001 mass-% (as defined above), are preferably selected from the group consisting of ammonium fluoride, ammonium bifluoride, triethanolammonium fluoride, diglycolammonium fluoride, methyldiethanolammonium fluoride, tetramethylammonium fluoride, triethylamine trihydrofluoride, hydrogen fluoride, fluoroboric acid, tetrafluoroboric acid, ammonium tetrafluoroborate, fluoroacetic acid, ammonium fluoroacetate, trifluoroacetic acid, fluorosilicic acid, ammonium fluorosilicate, tetrabutylammonium tetrafluoroborate and mixtures thereof.

Further preferred is a use of a cleaning composition in combination with one or more oxidants according to the invention as defined herein (or a use of a cleaning composition in combination with one or more oxidants according to the invention as described above or below as being preferred) wherein in the cleaning composition the total amount of the one or more solubilizers (A), preferably of 4-methylmorpholine-4-oxide, is in the range of from 1 mass-% to 15 mass-%, preferably in the range of from 2 mass-% to 12 mass-% and more preferably in the range of from 3 mass-% to 10 mass-%, relative to the total mass of the cleaning composition;

and/or the one, or at least one of the more, or all of the more, polar, non-protogenic organic solvents (C) (preferably all of the more polar, non-protogenic organic solvents (C)) is (are) an alkyl sulfone compound (alkyl sulfone compounds) of formula IV as defined above (or an alkyl sulfone compound(s) of formula IV as defined above as being preferred) and the total amount of the one or more solubilizers (A), preferably of 4-methylmorpholine-4-oxide, is in the range of from 1 mass-% to 15 mass-%, preferably in the range of from 5 mass-% to 15 mass-% and more preferably in the range of from 7 mass-% to 12 mass-%, relative to the total mass of the cleaning composition;

and/or the total amount of the one or more corrosion inhibitors (B), preferably selected from the group consisting of benzotriazoles which are unsubstituted or substituted once or twice independently by branched or unbranched alkyl having 1, 2, 3 or 4 carbon atoms and/or by halogen, and mixtures thereof, is in the range of from 0.1 mass-% to 6 mass-%, preferably in the range of from 0.2 mass-% to 6 mass-% and more preferably in the range of from 0.5 mass-% to 5 mass-%, relative to the total mass of the cleaning composition;

and/or the total amount of the one or more polar, non-protogenic organic solvents (C), preferably selected from the group consisting of dimethyl formamide, dimethyl sulfoxide, dimethyl acetamide, N-methylpyrrolidone, propylene carbonate, sulfolane, tetrahydrofuran and mixtures thereof, is in the range of from 1 mass-% to 50 mass-%, preferably in the range of from 3 mass-% to 45 mass-% and more preferably in the range of from 5 mass-% to 40 mass-%, relative to the total mass of the cleaning composition;

and/or the one, or at least one of the more, or all of the more, polar, non-protogenic organic solvents (C) (preferably all of the more polar, non-protogenic organic solvents (C)) is (are) an alkyl sulfone compound (alkyl sulfone compounds) of formula IV as defined above (or an alkyl sulfone compound(s) of formula IV as defined above as being preferred) and the total amount of the one or more polar, non-protogenic organic solvents (C) is in the range of from 10 mass-% to 50 mass-%, preferably in the range of from 15 mass-% to 45 mass-% and more preferably in the range of from >30 mass-% to 45 mass-%, relative to the total mass of the cleaning composition;

and/or the total amount of the one or more alkyl glycol ethers (E), preferably of the one or more alkyl glycol ethers of formula II, is in the range of from 5 mass-% to 50 mass-%, preferably in the range of from 10 mass-% to 40 mass-% and more preferably in the range of from 15 mass-% to 35 mass-%, relative to the total mass of the cleaning composition;

and/or the cleaning composition comprises at least the components (A), (B), (C), (D), (E) and (F), preferably the cleaning composition comprises at least the components (A), (B), (C), (D) and (F), more preferably the cleaning composition comprises the components (A), (B), (C), (D), (F), (G) and (H);

and/or water (D) makes up the balance to 100 mass-% of the cleaning composition.

In a first preferred alternative, a use of a cleaning composition in combination with one or more oxidants according to the invention as defined herein (or a use of a cleaning composition in combination with one or more oxidants according to the invention as described above or below as being preferred) is preferred, wherein the total amount of the one or more polar, non-protogenic organic solvents (C), preferably selected from the group consisting of dimethyl formamide, dimethyl sulfoxide, dimethyl acetamide, N-methylpyrrolidone, propylene carbonate, sulfolane, tetrahydrofuran and mixtures thereof, is in the range of from 5 mass-% to 15 mass-%, relative to the total mass of the cleaning composition;

In a second preferred alternative, a use of a cleaning composition in combination with one or more oxidants according to the invention as defined herein (or a use of a cleaning composition in combination with one or more oxidants according to the invention as described above or below as being preferred) is preferred, wherein the total amount of the one or more polar, non-protogenic organic solvents (C), preferably selected from the group consisting of dimethyl formamide, dimethyl sulfoxide, dimethyl acetamide, N-methylpyrrolidone, propylene carbonate, sulfolane, tetrahydrofuran and mixtures thereof, is in the range of from 30 mass-% to 40 mass-%, relative to the total mass of the cleaning composition.

For the use of a cleaning composition in combination with one or more oxidants according to the invention as defined herein (or the use of a cleaning composition in combination with one or more oxidants according to the invention as described above or below as being preferred), the oxidant is preferably applied in amounts relative to the cleaning composition as is explained and defined below for the wet-etch composition according to the present invention (or for its variants or preferred variants).

One preferred specific variant of the present invention pertains to a use of a cleaning composition in combination with one or more oxidants according to the invention as defined herein (or a use of a cleaning composition in combination with one or more oxidants according to the invention as described above or below as being preferred) wherein the cleaning composition comprises or consists of the following components:

(A) as solubilizer, 4-methylmorpholine-4-oxide,
  in a total amount in the range of from 2 mass-% to 12 mass-% and more preferably in the range of from 3 mass-% to 10 mass-%, relative to the total mass of the cleaning composition;

(B) one or more corrosion inhibitors, selected from the group consisting of benzotriazoles which are unsubstituted or substituted once or twice independently by unbranched alkyl having 1, 2, 3 or 4 carbon atoms, and mixtures thereof;
  in a total amount in the range of from 0.2 mass-% to 6 mass-%, preferably in the range of from 0.5 mass-% to 5 mass-%, relative to the total mass of the cleaning composition;

(C) one or more polar, non-protogenic organic solvents selected from the group consisting of dimethyl sulfoxide, sulfolane and mixtures thereof,
  in a total amount in the range of from 3 mass-% to 45 mass-%, preferably in the range of from 5 mass-% to 15 mass-%, relative to the total mass of the cleaning composition, (D) water, as a balance to 100 mass-% of the cleaning composition, (E) one or more alkyl glycol ethers of formula II $$H-\!\!\left[O-R^2\right]_n\!-O-R^3, \qquad (II)$$

wherein
  $R^2$ is an unbranched alkylen group having 2 to 4 carbon atoms,
  $R^3$ is a branched or unbranched alkyl group having 1 to 6 carbon atoms
  and
  n is an integer in the range of from 2 to 6
  in a total amount in the range of from 10 mass-% to 40 mass-%, preferably in the range of from 15 mass-% to 35 mass-%, relative to the total mass of the cleaning composition, (F) a buffering system which is suitable to buffer the pH of the cleaning composition in the range of from 6 to 9, preferably of from 7 to 8.5, and (G) one or more chelating agents, selected from the group consisting of 1,2-cyclohexylenedinitrilotetraacetic acid; N,N,N,N-ethylenediaminetetrakis(methylenephosphonic acid) and mixtures thereof,
  in a total amount in the range of from 0.1 mass-% to 2 mass-% preferably in the range of from 0.15 mass-% to 1.5 mass-%, relative to the total mass of the cleaning composition.

Another preferred specific variant of the present invention pertains to a use of a cleaning composition in combination with one or more oxidants according to the invention as defined herein (or a use of a cleaning composition in combination with one or more oxidants according to the invention as described above or below as being preferred) wherein the cleaning composition comprises or consists of the following components:

(A) as solubilizer, 4-methylmorpholine-4-oxide,
  in a total amount in the range of from 1 mass-% to 15 mass-% and more preferably in the range of from 8 mass-% to 15 mass-%, relative to the total mass of the cleaning composition;

(B) one or more corrosion inhibitors, selected from the group consisting of benzotriazoles which are unsubstituted or substituted once or twice independently by unbranched alkyl having 1, 2, 3 or 4 carbon atoms, and mixtures thereof;
  in a total amount in the range of from 0.2 mass-% to 6 mass-%, preferably in the range of from 0.5 mass-% to 5 mass-%, relative to the total mass of the cleaning composition;

(C) one or more polar, non-protogenic organic solvents, wherein all of the (more) polar, non-protogenic organic solvents (C) are alkyl sulfone compounds of formula IV (as defined above),
  wherein preferably the alkyl sulfone compounds of formula IV are selected from the group consisting of ethyl methyl sulfone, ethyl isopropyl sulfone, ethyl isobutyl sulfone, isopropyl isobutyl sulfone, sulfolane, 3-methoxy sulfolane and mixtures thereof, wherein more preferably the alkyl sulfone compounds of formula IV are selected from the group consisting of ethyl methyl sulfone, ethyl isopropyl sulfone, sulfolane and mixtures thereof, wherein even more preferably the alkyl sulfone compounds (compound) of formula IV is sulfolane;
  in a total amount in the range of from 10 mass-% to 50 mass-%, preferably in the range of from 15 mass-% to 45 mass-% and more preferably in the range of from >30 mass-% to 45 mass-%, relative to the total mass of the cleaning composition, (D) water, preferably as a balance to 100 mass-% of the cleaning composition, (F) a buffering system which is suitable to buffer the pH of the cleaning composition in the range of from 6 to 9, preferably of from 7 to 8.5, (G) one or more chelating agents, preferably selected from the group consisting of 1,2-cyclohexylenedinitrilotetraacetic acid; an ammonium compound of formula III as defined above (or as defined above as being preferred) and mixtures thereof,
  in a total amount in the range of from 0.1 mass-% to 2 mass-% preferably in the range of from 0.15 mass-% to 1.5 mass-%, relative to the total mass of the cleaning composition and (H) preferably one or more surfactants, preferably comprising one or more fluorosurfactants,
  (if present) in a total amount in the range of from 0.01 mass-% to 2 mass-% preferably in the range of from 0.02 mass-% to 1 mass-%, relative to the total mass of the cleaning composition.

Further preferred is also a use of a cleaning composition in combination with one or more oxidants according to the invention as defined herein (or a use of a cleaning composition in combination with one or more oxidants according to the invention as described above or below as being preferred) wherein the use comprises removing post-etch or post-ash residue from the surface of a semiconductor substrate and wherein the semiconductor substrate comprises at least one material selected from the group consisting of copper, cobalt, preferably tungsten, more preferably subjacent tungsten; and a low-k material, and/or the use comprises cleaning a semiconductor substrate comprising at least one material selected from the group consisting of copper, cobalt, preferably tungsten, more preferably subjacent tungsten; and a low-k material;

and/or the use comprises removing post-etch or post-ash residue from the surface of a semiconductor substrate in the presence of at least one material selected from the group consisting of copper, cobalt, preferably tungsten, more preferably subjacent tungsten; and a low-k material, wherein the post-etch or post-ash residue comprises one or more residues selected from the group comprising or consisting of one or more organic compounds, preferably organic polymers, comprising or not comprising fluorine, metal organic complexes and metallic materials, preferably titanium and/or an oxide of titanium and/or a nitride of titanium;

and/or the use comprises removing residues and contaminants from the surface of a semiconductor substrate comprising at least one material selected from the group consisting of copper, cobalt, preferably tungsten, more preferably subjacent tungsten; and a low-k material, wherein preferably the residues and contaminants comprise or consist of organic compounds, preferably organic polymers, comprising or not comprising fluorine.

The term “subjacent tungsten” as used in the present text means that the tungsten (as tungsten metal or as a tungsten material) is present under (and fully covered by) at least one layer of a low-k-material and preferably in addition by at least one etch-stop layer comprising or consisting of one or more aluminium compounds (which, if present, is usually positioned between the at least one layer of a low-k-material and the tungsten and separating the entire surface of the at least one layer of a low-k-material from the surface of the tungsten) as defined above. Preferably, a subjacent tungsten is therefore not directly exposed to a cleaning composition (in combination with one or more oxidants) or to a wet-etch composition (both as defined in the present text) in the course of a process for the manufacture of a semiconductor device (preferably as defined in the present text) but can get in contact with a cleaning composition (in combination with one or more oxidants) and/or with a wet-etch composition when said cleaning composition (in combination with one or more oxidants) or said wet-etch composition penetrate or diffuse through the at least one layer of a low-k-material and (if applicable) in addition through the at least one etch-stop layer comprising or consisting of one or more aluminium compounds.

Also preferred is a use of a cleaning composition in combination with one or more oxidants according to the invention as defined herein (or a use of a cleaning composition in combination with one or more oxidants according to the invention as described above or below as being preferred) wherein the use comprises etching, preferably oxidative etching, or partially etching, preferably partially oxidative etching, of a layer or mask, preferably a hard mask, comprising or consisting of a material selected from the group consisting of Ti, TiN, Ta, TaN, Al and $HfO_x$ and/or a layer or mask, preferably a hard mask, comprising or consisting of a material selected from the group consisting of tungsten carbide ($WC_x$) and tungsten nitride ($WN_x$), and wherein the (oxidative) etching or partially (oxidative) etching of a layer or mask, preferably a hard mask, comprises removing or partially removing a metal-containing hard mask, preferably selected from the group consisting of a Ti hard mask, a TiN hard mask, a Ta hard mask, a TaN hard mask, an Al hard mask and a $HfO_x$ hard mask and/or selected from the group consisting of a tungsten carbide ($WC_x$) hard mask and a tungsten nitride ($WN_x$) hard mask; more preferably a TiN hard mask, preferably in the presence of at least one material selected from the group consisting of copper, cobalt, preferably tungsten, more preferably subjacent tungsten; and a low-k material, and/or etching, preferably oxidative etching, or partially etching, preferably partially oxidative etching, in the presence of at least one material selected from the group consisting of copper, cobalt, preferably tungsten, more preferably subjacent tungsten; and a low-k material, on the surface of a semiconductor substrate;

and/or etching, preferably selectively etching, a layer comprising an aluminium compound in the presence of a layer of a low-k material and/or preferably a layer comprising tungsten, more preferably subjacent tungsten; and/or a layer comprising copper and/or cobalt;

and/or removing, preferably selectively removing, from a semiconductor substrate a layer comprising an aluminium compound in the presence of a layer of a low-k material and/or preferably a layer comprising tungsten, more preferably subjacent tungsten, and/or a layer comprising copper and/or cobalt, and/or removing, preferably selectively removing, from the surface of a semiconductor substrate a layer comprising an aluminium compound in the presence of a layer of a low-k material and/or preferably a layer comprising tungsten, more preferably subjacent tungsten, and/or a layer comprising copper and/or cobalt.

In a particularly preferred variant of the present invention, a use of a cleaning composition in combination with one or more oxidants according to the invention as defined herein (or a use of a cleaning composition in combination with one or more oxidants according to the invention as described above or below as being preferred) is preferred wherein the cleaning composition is used in combination with the one or more oxidants in a one-step-process of removing (i) a metal-containing hard mask, preferably selected from the group consisting of a Ti hard mask, a TiN hard mask, a Ta hard mask, a TaN hard mask, an Al hard mask and a $HfO_x$ hard mask and/or selected from the group consisting of a tungsten carbide ($WC_x$) hard mask and a tungsten nitride ($WN_x$) hard mask, more preferably a TiN hard mask, and (ii) an etch-stop layer of an aluminium compound deposited on a layer comprising copper, preferably a copper layer, and/or on a layer comprising cobalt, preferably a cobalt layer;

preferably in the presence of tungsten which is fully covered by at least one layer of a low-k material (and preferably in addition by at least one etch-stop layer comprising or consisting of one or more aluminium compounds which is positioned between the tungsten and the at least one layer of a low-k material);

and/or the cleaning composition is used in combination with the one or more oxidants in a separate step or simultaneously in the same step, preferably simultaneously in the same step;

and/or the one or more oxidants are selected from the group consisting of hydrogen peroxide, peroxide urea, peroxydisulfuric acid, ammonium persulfate, peroxymonosulfuric acid, pyrosulfuric acid, ozone and mixtures thereof; and preferably the one or one of the more oxidants is hydrogen peroxide;

and/or the one or more oxidants, preferably hydrogen peroxide, are used in a total amount in the range of from 2 mass-% to 25 mass-%, preferably in the range of from 5 mass-% to 20 mass-%, more preferably in the range of from 7.5 mass-% to 20 mass-% and even more preferably of from 10 mass-% to 17.5 mass-%, relative to the total mass of the cleaning composition;

and/or one or more stabilizers are used in combination with the one or more oxidants and/or in combination with the cleaning composition, preferably selected from the group consisting of amine-N-oxides; citric acid; 1-hydroxyethane 1,1-diphosphonic acid; glycolic acid; lactic acid; hydroxybutyric acid; glyceric acid; malic acid; tartaric acid; malonic acid; succinic acid; glutaric acid; maleic acid and mixtures thereof.

The present invention also pertains to a cleaning composition as defined above (or a cleaning composition as defined above as being preferred), in particular as defined above in the context of the use of a cleaning composition in combination with one or more oxidants according to the present invention (including all its variants and preferred variants).

Generally, all aspects of the present invention discussed herein in the context of the inventive use of a cleaning composition in combination with one or more oxidants apply mutatis mutandis to the cleaning composition according to the present invention as defined here above and below. And likewise all aspects of the cleaning composition according to the present invention discussed herein apply mutatis mutandis to the inventive use of the cleaning composition in combination with one or more oxidants (as defined above).

A cleaning composition according to the invention as defined herein (or a cleaning composition according to the invention as described above or below as being preferred) is preferred wherein the total amount of etchants comprising fluoride anions is <0.001 mass-%, relative to the total mass of the cleaning composition, wherein preferably the cleaning composition does not comprise etchants comprising fluoride anions;

and/or the cleaning composition comprises (F) a buffering system which is suitable to buffer the pH of the cleaning composition in the range of from 6 to 9, and/or the cleaning composition comprises as component (E) one or more alkyl glycol ethers of formula II and in the one or more alkyl glycol ethers of formula II, $R^2$ is a branched or unbranched alkylen group having 3 to 4 carbon atoms;

and/or $R^3$ is a branched or unbranched alkyl group having 1, 2, 3, 5 or 6 carbon atoms;

and/or n is an integer in the range of from 2 to 4;

and/or the specific compound butyl diglycol is not comprised.

The present invention also pertains to the use of a cleaning composition as defined above (or to the use of a cleaning composition as defined above as being preferred), for removing post-etch or post-ash residue from the surface of a semiconductor substrate.

Generally, all aspects of the present invention discussed herein in the context of the inventive use of a cleaning composition in combination with one or more oxidants and/or the inventive cleaning composition apply mutatis mutandis to the use of the cleaning composition for removing post-etch or post-ash residue from the surface of a semiconductor substrate according to the present invention as defined here above and below. And likewise all aspects of the use of the cleaning composition for removing post-etch or post-ash residue from the surface of a semiconductor substrate according to the present invention as discussed herein apply mutatis mutandis to the inventive use of the cleaning composition in combination with one or more oxidants and/or to the inventive cleaning composition (both as defined above).

It has been found in own experiments that a cleaning composition according to the present invention as defined above, in particular a cleaning composition wherein the one, or at least one of the more, or (in a particularly preferred variant of this aspect of the present invention) all of the more, polar non-protogenic organic solvents (C) is (are) an alkyl sulfone compound (alkyl sulfone compounds) of formula IV (or an alkyl sulfone compound(s) of formula IV which is described herein as preferred), is particularly suited for (a) reducing the number of nanometer-scale particles (e.g. from the environment) which may be present or may settle on the surface of a semiconductor substrate (or avoiding the introduction to or adsorption of such nanometer-scale particles from e.g. the environment on the surface of a semiconductor substrate): it has been found in own experiments that such nanometer-scale particles (e.g. particles of $SiO_x$, SiC SiOC or Ti ions) would tend to gradually aggregate to the sub-micrometer-scale or micrometer-scale and, if being introduced to or adsorbed on the surface of a semiconductor substrate (and not removed by application of the cleaning composition according to the invention), may cause defects in a semiconductor product manufactured from said semiconductor substrate;

and/or (b) removing particles, in particular particles of post-etch or post-ash residue, from the surface of a semiconductor substrate.

It has also been found that these above two effects were more pronounced for a cleaning composition according to the invention comprising only one or more alkyl sulfone compounds of formula IV as the one or more polar non-protogenic organic solvents (C) (but no alkyl glycol ethers (E), e.g. cleaning compositions CCI1 or CCI14) than it was for a similar cleaning composition comprising (i) one or more alkyl glycol ethers (E) but no polar non-protogenic organic solvents (C) (e.g. comprising butyl diglycol, see e.g.

cleaning composition CCI13) or for a similar cleaning composition comprising (ii) one or more alkyl glycol ethers (E) and one or more polar non-protogenic organic solvents (C), which, however, were not alkyl sulfone compounds of formula IV (e.g. comprising butyl diglycol and dimethyl sulfoxide, see e.g. cleaning composition CCI12).

It has furthermore been found in own experiments that a cleaning composition according to the present invention as defined above, in particular a cleaning composition wherein the one, or at least one of the more, or (in a particularly preferred variant of this aspect of the present invention) all of the more, polar non-protogenic organic solvents (C) is (are) an alkyl sulfone compound (alkyl sulfone compounds) of formula IV (or an alkyl sulfone compound(s) of formula IV which is described herein as preferred), has a particularly low tendency for clouding.

A use is preferred of a cleaning composition as defined above (or of a cleaning composition as defined above as being preferred), for removing post-etch or post-ash residue from the surface of a semiconductor substrate, wherein the semiconductor substrate comprises at least one material selected from the group consisting of copper, cobalt, preferably tungsten, and a low-k material, and/or the use comprises cleaning a semiconductor substrate comprising at least one material selected from the group consisting of copper, cobalt, preferably tungsten, and a low-k material;

and/or the use comprises removing post-etch or post-ash residue from the surface of a semiconductor substrate in the presence of at least one material selected from the group consisting of copper, cobalt, preferably tungsten, and a low-k material, wherein the post-etch or post-ash residue comprises one or more residues selected from the group comprising or consisting of one or more organic compounds, preferably organic polymers, comprising or not comprising fluorine, metal organic complexes and metallic materials, preferably titanium and/or an oxide of titanium and/or a nitride of titanium;

and/or the use comprises removing residues and contaminants from the surface of a semiconductor substrate comprising at least one material selected from the group consisting of copper, cobalt, preferably tungsten, and a low-k material, wherein preferably the residues and contaminants comprise or consist of organic compounds, preferably organic polymers, comprising or not comprising fluorine.

The present invention also pertains to a wet-etch composition comprising (W1) a cleaning composition according to the present invention as defined above (or a cleaning composition composition according to the present invention as defined above as being preferred), in particular as defined above in the context of the use of a cleaning composition in combination with one or more oxidants according to the present invention (including all its variants and preferred variants)

and (W2) one or more oxidants, preferably selected from the group consisting of hydrogen peroxide, peroxide urea, peroxydisulfuric acid, ammonium persulfate, peroxymonosulfuric acid, pyrosulfuric acid and ozone; preferably in a total amount in the range of from 2 mass-% to 25 mass-%, preferably in the range of from 5 mass-% to 20 mass-%, more preferably in the range of from 7.5 mass-% to 20 mass-% and even more preferably of from 10 mass-% to 17.5 mass-%, relative to the total mass of the cleaning composition Generally, all aspects of the present invention discussed herein in the context of the inventive use of a cleaning composition in combination with one or more oxidants, the inventive cleaning composition and/or the inventive use of the cleaning composition for removing post-etch or post-ash residue apply mutatis mutandis to the wet-etch composition according to the present invention as defined here above and below. And likewise all aspects of the wet-etch composition according to the present invention as discussed herein apply mutatis mutandis to the inventive use of a cleaning composition in combination with one or more oxidants, the inventive cleaning composition and/or the inventive use of the cleaning composition for removing post-etch or post-ash residue.

A wet-etch composition according to the invention as defined herein (or a wet-etch composition according to the invention as described above or below as being preferred) is preferred which has a pH in the range of from 6 to 9, preferably of from 6.5 to 8.0.

Similar to what has been explained above in the context of the inventive use of a cleaning composition in combination with one or more oxidants, it has been found in own experiments that a wet-etch composition according to the present invention as defined above (in particular a wet-etch composition according to the present invention described herein as being preferred), in particular a wet-etch composition wherein the one, or at least one of the more, or (in a particularly preferred variant of this aspect of the present invention) all of the more, polar non-protogenic organic solvents (C) is (are) an alkyl sulfone compound (alkyl sulfone compounds) of formula IV (or an alkyl sulfone compound(s) of formula IV which is described herein as preferred), shows the following beneficial effects:

a high selectivity for etching, in particular oxidative etching, or partially etching, in particular partially oxidative etching, of a layer or mask, comprising or consisting of a material selected from the group consisting of Ti, TiN, Ta, TaN, Al and $HfO_x$ and/or a layer or mask comprising or consisting of a material selected from the group consisting of tungsten carbide ($WC_x$) and tungsten nitride ($WN_x$), in particular comprising or consisting of TiN, in particular in the presence of at least one material selected from the group consisting of copper, cobalt, preferably tungsten, and a low-k material, on the surface of a semiconductor substrate;

and a high etch-rate stability over extended periods of time. Said high etch-rate stability results in a long-lasting and high (selective) etch-rate performed on a layer or mask, comprising or consisting of a material selected from the group consisting of Ti, TiN, Ta, TaN, Al and $HfO_x$ and/or on a layer or mask comprising or consisting of a material selected from the group consisting of tungsten carbide ($WC_x$) and tungsten nitride ($WN_x$); in particular comprising or consisting of TiN (as specified above). For example, said wet-etch composition may preserve a high and selective etch-rate performed on a layer or mask comprising or consisting of TiN for a period of 24 hours or more (also see the examples sections).

Furthermore, the present invention also pertains to the use of a wet-etch composition as defined above (or to the use of a wet-etch composition as defined above as being preferred), for removing or partially removing a metal-containing hard mask, preferably selected from the group consisting of a Ti hard mask, a TiN hard mask, a Ta hard mask, a TaN hard mask, an Al hard mask and a $HfO_x$ hard mask and/or selected from the group consisting of a tungsten carbide ($WC_x$) hard mask and a tungsten nitride ($WN_x$) hard mask; more preferably a TiN hard mask, preferably in the presence of at least one material selected from the group consisting of copper, cobalt, preferably tungsten, more preferably subjacent tungsten; and a low-k material, and/or etching, preferably oxidative etching, or partially etching, preferably partially oxidative etching, of a layer or mask, comprising or consisting of a material selected from the group consisting of Ti, TiN, Ta, TaN, Al and $HfO_x$ and/or a layer or mask comprising or consisting of a material selected from the group consisting of tungsten carbide ($WC_x$) and tungsten nitride ($WN_x$); preferably comprising or consisting of TiN, preferably in the presence of at least one material selected from the group consisting of copper, cobalt, preferably tungsten, more preferably subjacent tungsten; and a low-k material, on the surface of a semiconductor substrate;

and/or etching, preferably selectively etching, a layer comprising an aluminium compound in the presence of a layer of a low-k material and/or a layer comprising copper and/or cobalt and/or preferably a layer comprising tungsten, more preferably subjacent tungsten;

and/or removing, preferably selectively removing, from a semiconductor substrate a layer comprising an aluminium compound in the presence of a layer of a low-k material and/or a layer comprising copper and/or cobalt and/or preferably a layer comprising tungsten, more preferably subjacent tungsten;

and/or removing, preferably selectively removing, from the surface of a semiconductor substrate a layer comprising an aluminium compound in the presence of a layer of a low-k material and/or a layer comprising copper and/or cobalt and/or preferably a layer comprising tungsten, more preferably subjacent tungsten;

and/or removing post-etch or post-ash residue from the surface of a semiconductor substrate, preferably in the presence of at least one material selected from the group consisting of copper, cobalt, preferably tungsten, more preferably subjacent tungsten, and a low-k material, wherein the post-etch or post-ash residue preferably comprises one or more residues selected from the group comprising or consisting of:

one or more organic compounds, preferably organic polymers, comprising or not comprising fluorine, metal organic complexes and metallic materials, preferably titanium and/or an oxide of titanium and/or a nitride of titanium.

Generally, all aspects of the present invention discussed herein in the context of the inventive use of a cleaning composition in combination with one or more oxidants, the inventive cleaning composition, the inventive use of the cleaning composition for removing post-etch or post-ash residue and/or of the inventive wet-etch composition apply mutatis mutandis to the use of the wet-etch composition according to the present invention as defined here above and below. And likewise all aspects of the wet-etch composition according to the present invention as discussed herein apply mutatis mutandis to the inventive use of a cleaning composition in combination with one or more oxidants, the inventive cleaning composition, the inventive use of the cleaning composition for removing post-etch or post-ash residue and/or of the inventive wet-etch composition.

Under a further aspect, the present invention also pertains to a process for the manufacture of a semiconductor device from a semiconductor substrate, comprising the following steps P1) preparing a wet-etch composition by mixing a cleaning composition according to the present invention as defined above (or a cleaning composition composition according to the present invention as defined above as being preferred) with one or more oxidants, preferably selected from the group consisting of hydrogen peroxide, peroxide urea, peroxydisulfuric acid, ammonium persulfate, peroxymonosulfuric acid, pyrosulfuric acid, ozone and mixtures thereof, or providing a wet-etch composition according to the present invention as defined above (or a wet-etch composition according to the present invention as defined above as being preferred), and P2) contacting at least once with the wet-etch composition received or provided in step P1), preferably in the presence of at least one material selected from the group consisting of copper, cobalt, preferably tungsten, more preferably subjacent tungsten, and a low-k material, a layer or mask, preferably selected from the group consisting of a Ti layer or mask, a TiN layer or mask, a Ta layer or mask, a TaN layer or mask, an Al layer or mask and a $HfO_x$ layer or mask and/or selected from the group consisting of a tungsten carbide ($WC_x$) layer or mask and a tungsten nitride ($WN_x$) layer or mask; more preferably a TiN layer or mask, on the surface of a semiconductor substrate, and/or an etch-stop layer comprising or consisting of one or more aluminium compounds deposited on a layer comprising copper, preferably a copper layer, and/or on a layer comprising cobalt, preferably a cobalt layer, on the surface of a semiconductor substrate, preferably so as to etch, preferably selectively oxidatively etch, or partially etch, preferably selectively partially oxidatively etch, said layer or mask and/or remove, preferably selectively remove, from the surface of the semiconductor substrate the etch-stop layer comprising the aluminium compound, and/or remove post-etch or post-ash residue from the surface of said semiconductor substrate, preferably in a one-step process.

Generally, all aspects of the present invention discussed herein in the context of the inventive use of a cleaning composition in combination with one or more oxidants, the inventive cleaning composition, the inventive use of the cleaning composition for removing post-etch or post-ash residue, of the inventive wet-etch composition and/or of the inventive use of a wet-etch composition apply mutatis mutandis to the process for the manufacture of a semiconductor device according to the present invention as defined here above and below. And likewise all aspects of the process for the manufacture of a semiconductor device according to the present invention as discussed herein apply mutatis mutandis to the inventive use of a cleaning composition in combination with one or more oxidants, the inventive cleaning composition, the inventive use of the cleaning composition for removing post-etch or post-ash residue, of the inventive wet-etch composition and/or of the inventive use of a wet-etch composition.

Under a further aspect, the present invention also pertains to a kit preferably for post-etch or post-ash residue removal from the surface of a semiconductor substrate and/or for etching, preferably for oxidative etching, or partially etching, preferably partially oxidative etching, of a layer or mask comprising or consisting of a material selected from the group consisting of Ti, TiN, Ta, TaN, Al and $HfO_x$ and/or a layer or mask comprising or consisting of a material selected from the group consisting of tungsten carbide ($WC_x$) and tungsten nitride ($WN_x$); preferably, comprising or consisting of TiN, on the surface of a semiconductor substrate and/or for etching, preferably selectively etching, a layer comprising or consisting of one or more aluminium compounds in the presence of a layer of a low-k material and/or preferably a layer comprising tungsten, more preferably subjacent tungsten, and/or a layer comprising copper and/or cobalt on the surface of a semiconductor substrate, comprising as separate components:

(K1) a cleaning composition according to the present invention as defined above (or a cleaning composition according to the present invention as defined above as being preferred)

and (K2) one or more oxidants, preferably selected from the group consisting of hydrogen peroxide, peroxide urea, peroxydisulfuric acid, ammonium persulfate, peroxymonosulfuric acid, pyrosulfuric acid, ozone and mixtures thereof; more preferably the one or one of the more oxidants is hydrogen peroxide;

and further optionally comprising, as separate component or combined with component (K1) and/or with component (K2):

(K3) one or more stabilizers, preferably selected from the group consisting of amine N-oxides; citric acid; 1-hydroxyethane 1,1-diphosphonic acid; glycolic acid; lactic acid; hydroxybutyric acid; glyceric acid; malic acid; tartaric acid; malonic acid; succinic acid; glutaric acid; maleic acid and mixtures thereof.

Generally, all aspects of the present invention discussed herein in the context of the inventive use of a cleaning composition in combination with one or more oxidants, the inventive cleaning composition, the inventive use of the cleaning composition for removing post-etch or post-ash residue, of the inventive wet-etch composition, of the inventive use of a wet-etch composition and/or of the inventive process for the manufacture of a semiconductor device apply mutatis mutandis to the kit according to the present invention as defined here above and below. And likewise all aspects of the kit according to the present invention as discussed herein apply mutatis mutandis to the inventive use of a cleaning composition in combination with one or more oxidants, the inventive cleaning composition, the inventive use of the cleaning composition for removing post-etch or post-ash residue, the inventive wet-etch composition, the inventive use of a wet-etch composition and/or the inventive process for the manufacture of a semiconductor device.

The cleaning composition according to the invention (including all its variants and preferred variants as defined herein), the wet-etch composition according to the invention (including all its variants and preferred variants as defined herein) and/or the kit according to the invention (including all its variants and preferred variants as defined herein) are designed and intended for use or application in the process for the manufacture of a semiconductor device (including all variants and preferred variants of this process as defined herein).

The present invention is, or variants thereof are, also summarized and defined in the following aspects A1 to A15:

A1. Use of a cleaning composition comprising at least the following components:

(A) as solubilizer, one or more compounds of formula I:

(I)

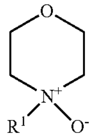

wherein $R^1$ is selected from the group consisting of branched or unbranched alkyl having 1, 2, 3 or 4 carbon atoms;

(B) one or more corrosion inhibitors, selected from the group consisting of benzotriazoles which are unsubstituted or substituted once or twice independently by branched or unbranched alkyl having 1, 2, 3 or 4 carbon atoms, aminoalkyl wherein the alkyl is branched or unbranched and has 1, 2, 3 or 4 carbon atoms, phenyl, thiophenyl, halogen, hydroxy, nitro and/or thiol, and mixtures thereof;

(C) one or more polar, non-protogenic organic solvents; and (D) water, in combination with one or more oxidants for removing post-etch or post-ash residue from the surface of a semiconductor substrate and/or for etching or partially etching of a layer or mask comprising or consisting of a material selected from the group consisting of Ti, TiN, Ta, TaN, Al and $HfO_x$.

A2. Use according to aspect A1, wherein the cleaning composition comprises as further component:

(E) one or more alkyl glycol ethers.

A3. Use according to aspect A2, wherein component (E) is selected from the group consisting of alkyl glycol ethers having a Hansen Polar Solubility Parameter $\delta_p$ of ≤8 $(MPa)^{1/2}$ and/or the cleaning composition comprises as component (E) one or more alkyl glycol ethers of formula II (II)

$$H\text{-}[O\text{-}R^2]_n\text{-}O\text{-}R^3,$$

wherein $R^2$ is a branched or unbranched alkylen group having 1 to 6, preferably 2 to 4, carbon atoms, $R^3$ is a branched or unbranched alkyl group having 1 to 8, preferably 1 to 6, carbon atoms and n is an integer in the range of from 1 to 6, preferably of from 2 to 6.

A4. Use according to any of the preceding aspects, wherein the cleaning composition further comprises:

(F) a buffering system which is suitable to buffer the pH of the cleaning composition in the range of from 6 to 9, preferably of from 7 to 8.5;

and/or (G) one or more chelating agents, preferably in a total amount in the range of from 0.01 mass-% to 3 mass-%, more preferably in the range of from 0.1 mass-% to 2 mass-% and yet more preferably in the range of from 0.15 mass-% to 1.5 mass-%, relative to the total mass of the cleaning composition;

and/or (H) one or more surfactants, preferably comprising one or more fluorosurfactants.

A5. Use according to any of the preceding aspects, wherein in the cleaning composition the one or at least one of the more solubilizers (A) is or comprises 4-methylmorpholine-4-oxide, and/or the one or at least one of the more corrosion inhibitors (B) is selected from the group consisting of benzotriazoles which are unsubstituted or substituted once or twice independently by branched or unbranched alkyl having 1, 2, 3 or 4 carbon atoms and/or by halogen, preferably selected from the group consisting of chlorine and bromine, and mixtures thereof;

and/or the one or at least one of the more polar, non-protogenic organic solvents (C) is selected from the group consisting of dimethyl formamide, dimethyl sulfoxide, dimethyl acetamide, N-methylpyrrolidone, propylene carbonate, sulfolane, tetrahydrofuran and mixtures thereof, wherein preferably the one or at least one of the more polar, non-protogenic organic solvents (C) is dimethyl sulfoxide, and/or the total amount of etchants comprising fluoride anions is <0.001 mass-%, relative to the total mass of the cleaning composition, wherein preferably the cleaning composition does not comprise etchants comprising fluoride anions;

and/or in the one or more alkyl glycol ethers of formula II, $R^2$ is a branched or unbranched alkylen group having 3 to 4 carbon atoms;

and/or $R^3$ is a branched or unbranched alkyl group having 1, 2, 3, 5 or 6 carbon atoms;

and/or n is an integer in the range of from 2 to 4;

and/or the specific compound butyl diglycol is not comprised.

A6. Use according to any of the preceding aspects, wherein in the cleaning composition the total amount of the one or more solubilizers (A), preferably of 4-methylmorpholine-4-oxide, is in the range of from 1 mass-% to 15 mass-%, preferably in the range of from 2 mass-% to 12 mass-% and more preferably in the range of from 3 mass-% to 10 mass-%, relative to the total mass of the cleaning composition, and/or the total amount of the one or more corrosion inhibitors (B), preferably selected from the group consisting of benzotriazoles which are unsubstituted or substituted once or twice independently by branched or unbranched alkyl having 1, 2, 3 or 4 carbon atoms and/or by halogen, and mixtures thereof, is in the range of from 0.1 mass-% to 6 mass-%, preferably in the range of from 0.2 mass-% to 6 mass-% and more preferably in the range of from 0.5 mass-% to 5 mass-%, relative to the total mass of the cleaning composition;

and/or the total amount of the one or more polar, non-protogenic organic solvents (C), preferably selected from the group consisting of dimethyl formamide, dimethyl sulfoxide, dimethyl acetamide, N-methylpyrrolidone, propylene carbonate, sulfolane, tetrahydrofuran and mixtures thereof, is in the range of from 1 mass-% to 50 mass-%, preferably in the range of from 3 mass-% to 45 mass-% and more preferably in the range of from 5 mass-% to 40 mass-%, relative to the total mass of the cleaning composition;

and/or the total amount of the one or more alkyl glycol ethers (E), preferably of the one or more alkyl glycol ethers of formula II, is in the range of from 5 mass-% to 50 mass-%, preferably in the range of from 10 mass-% to 40 mass-% and more preferably in the range of from 15 mass-% to 35 mass-%, relative to the total mass of the cleaning composition;

and/or the cleaning composition comprises at least the components (A), (B), (C), (D), (E) and (F);

and/or water (D) makes up the balance to 100 mass-% of the cleaning composition.

A7. Use according to any of the preceding aspects, wherein the use comprises removing post-etch or post-ash residue from the surface of a semiconductor substrate and wherein the semiconductor substrate comprises at least one material selected from the group consisting of copper, cobalt, preferably tungsten, and a low-k material, and/or the use comprises cleaning a semiconductor substrate comprising at least one material selected from the group consisting of copper, cobalt, preferably tungsten, and a low-k material;

and/or the use comprises removing post-etch or post-ash residue from the surface of a semiconductor substrate in the presence of at least one material selected from the group consisting of copper, cobalt, preferably tungsten, and a low-k material, wherein the post-etch or post-ash residue comprises one or more residues selected from the group comprising or consisting of one or more organic compounds, preferably organic polymers, comprising or not comprising fluorine, metal organic complexes and metallic materials, preferably titanium and/or an oxide of titanium and/or a nitride of titanium;

and/or the use comprises removing residues and contaminants from the surface of a semiconductor substrate comprising at least one material selected from the group consisting of copper, cobalt, preferably tungsten, and a low-k material, wherein preferably the residues and contaminants comprise or consist of organic compounds, preferably organic polymers, comprising or not comprising fluorine.

A8. Use according to any of the preceding aspects, wherein the use comprises etching, preferably oxidative etching, or partially etching, preferably partially oxidative etching, of a layer or mask, preferably a hard mask, comprising or consisting of a material selected from the group consisting of Ti, TiN, Ta, TaN, Al and $HfO_x$ wherein the etching or partially etching of a layer or mask, preferably a hard mask, comprises removing or partially removing a metal-containing hard mask, preferably selected from the group consisting of a Ti hard mask, a TiN hard mask, a Ta hard mask, a TaN hard mask, an Al hard mask and a HfOx hard mask, more preferably a TiN hard mask, preferably in the presence of at least one material selected from the group consisting of copper, cobalt, preferably tungsten, and a low-k material, and/or etching, preferably oxidative etching, or partially etching, preferably partially oxidative etching, in the presence of at least one material selected from the group consisting of copper, cobalt, preferably tungsten, and a low-k material, on the surface of a semiconductor substrate;

and/or etching, preferably selectively etching, a layer comprising an aluminium compound in the presence of a layer of a low-k material and/or preferably a layer comprising tungsten and/or a layer comprising copper and/or cobalt;

and/or removing, preferably selectively removing, from a semiconductor substrate a layer comprising an aluminium compound in the presence of a layer of a low-k material and/or preferably a layer comprising tungsten and/or a layer comprising copper and/or cobalt, and/or removing, preferably selectively removing, from the surface of a semiconductor substrate a layer comprising an aluminium compound in the presence of a layer of a low-k material and/or preferably a layer comprising tungsten and/or a layer comprising copper and/or cobalt.

A9. Use according to any of the preceding aspects, wherein the cleaning composition is used in combination with the one or more oxidants in a one-step-process of removing (i) a metal-containing hard mask, preferably selected from the group consisting of a Ti hard mask, a TiN hard mask, a Ta hard mask, a TaN hard mask, an Al hard mask and a $HfO_x$ hard mask, more preferably a TiN hard mask and (ii) an etch-stop layer of an aluminium compound deposited on a layer comprising copper, preferably a copper layer, and/or on a layer comprising cobalt, preferably a cobalt layer;

preferably in the presence of tungsten which is fully covered by at least one layer of a low-k material;

and/or the cleaning composition is used in combination with the one or more oxidants in a separate step or simultaneously in the same step, preferably simultaneously in the same step;

and/or the one or more oxidants are selected from the group consisting of hydrogen peroxide, peroxide urea, peroxydisulfuric acid, ammonium persulfate, peroxymonosulfuric acid, pyrosulfuric acid, ozone and mixtures thereof; and preferably the one or one of the more oxidants is hydrogen peroxide;

and/or the one or more oxidants, preferably hydrogen peroxide, are used in a total amount in the range of from 2 mass-% to 25 mass-%, preferably in the range of from 5 mass-% to 20 mass-%, more preferably in the range of from 7.5 mass-% to 20 mass-% and even more preferably of from 10 mass-% to 17.5 mass-%, relative to the total mass of the cleaning composition;

and/or one or more stabilizers are used in combination with the one or more oxidants and/or in combination with the cleaning composition, preferably selected from the group consisting of amine-N-oxides; citric acid; 1-hydroxyethane 1,1-diphosphonic acid; glycolic acid; lactic acid; hydroxybutyric acid; glyceric acid; malic acid; tartaric acid; malonic acid; succinic acid; glutaric acid; maleic acid and mixtures thereof.

A10. Cleaning composition, as defined in any of aspects 1 to 6.

A11. Use of a cleaning composition according to aspect 10, for removing post-etch or post-ash residue from the surface of a semiconductor substrate, preferably as defined in aspect 1 and/or 7.

A12. Wet-etch composition comprising (W1) a cleaning composition as defined in any of aspects 1 to 6, preferably as defined in any of aspects 2 to 6 and (W2) one or more oxidants, preferably selected from the group consisting of hydrogen peroxide, peroxide urea, peroxydisulfuric acid, ammonium persulfate, peroxymonosulfuric acid, pyrosulfuric acid and ozone;

preferably in a total amount in the range of from 2 mass-% to 25 mass-%, preferably in the range of from 5 mass-% to 20 mass-%, more preferably in the range of from 7.5 mass-% to 20 mass-% and even more preferably of from 10 mass-% to 17.5 mass-%, relative to the total mass of the cleaning composition A13. Use of a wet-etch composition according to aspect 12, for removing or partially removing a metal-containing hard mask, preferably selected from the group consisting of a Ti hard mask, a TiN hard mask, a Ta hard mask, a TaN hard mask, an Al hard mask and a $HfO_x$ hard mask, more preferably a TiN hard mask, preferably in the presence of at least one material selected from the group consisting of copper, cobalt, preferably tungsten, and a low-k material, and/or etching, preferably oxidative etching, or partially etching, preferably partially oxidative etching, of a layer or mask, comprising or consisting of a material selected from the group consisting of Ti, TiN, Ta, TaN, Al and $HfO_x$, preferably comprising or consisting of TiN, preferably in the presence of at least one material selected from the group consisting of copper, cobalt, preferably tungsten, and a low-k material, on the surface of a semiconductor substrate;

and/or etching, preferably selectively etching, a layer comprising an aluminium compound in the presence of a layer of a low-k material and/or a layer comprising copper and/or cobalt and/or preferably a layer comprising tungsten;

and/or removing, preferably selectively removing, from a semiconductor substrate a layer comprising an aluminium compound in the presence of a layer of a low-k material and/or a layer comprising copper and/or cobalt and/or preferably a layer comprising tungsten;

and/or removing, preferably selectively removing, from the surface of a semiconductor substrate a layer comprising an aluminium compound in the presence of a layer of a low-k material and/or a layer comprising copper and/or cobalt and/or preferably a layer comprising tungsten;

and/or removing post-etch or post-ash residue from the surface of a semiconductor substrate, preferably in the presence of at least one material selected from the group consisting of copper, cobalt, preferably tungsten, and a low-k material, wherein the post-etch or post-ash residue preferably comprises one or more residues selected from the group comprising or consisting of:

one or more organic compounds, preferably organic polymers, comprising or not comprising fluorine, metal organic complexes and metallic materials, preferably titanium and/or an oxide of titanium and/or a nitride of titanium.

A14. Process for the manufacture of a semiconductor device from a semiconductor substrate, comprising the following steps P1) preparing a wet-etch composition by mixing a cleaning composition according to any of aspects 1 to 6, preferably according to any of aspects 2 to 6, with one or more oxidants, preferably selected from the group consisting of hydrogen peroxide, peroxide urea, peroxydisulfuric acid, ammonium persulfate, peroxymonosulfuric acid, pyrosulfuric acid, ozone and mixtures thereof, or providing a wet-etch composition according to aspect 12, and P2) contacting at least once with the wet-etch composition received or provided in step P1), preferably in the presence of at least one material selected from the group consisting of copper, cobalt, preferably tungsten, and a low-k material, a layer or hard mask, preferably selected from the group consisting of a Ti layer or mask, a TiN layer or mask, a Ta layer or mask, a TaN layer or mask, an Al layer or mask and a $HfO_x$ layer or mask, more preferably a TiN layer or mask, on the surface of a semiconductor substrate, and/or an etch-stop layer comprising or consisting of one or more aluminium compounds deposited on a layer comprising copper, preferably a copper layer, and/or on a layer comprising cobalt, preferably a cobalt layer, on the surface of a semiconductor substrate, preferably so as to etch, preferably selectively oxidatively etch, or partially etch, preferably selectively partially oxidatively etch, said layer or mask and/or remove, preferably selectively remove, from the surface of the semiconductor substrate the etch-stop layer comprising or consisting of one or more aluminium compounds, and/or remove post-etch or post-ash residue from the surface of said semiconductor substrate, preferably in a one-step process.

A15. Kit, preferably for post-etch or post-ash residue removal from the surface of a semiconductor substrate and/or for etching, preferably for oxidative etching, or partially etching, preferably partially oxidative etching, of a layer or mask, comprising or consisting of TiN, on the surface of a semiconductor substrate and/or for etching, preferably selectively etching, a layer comprising or consisting of one or more aluminium compounds in the presence of a layer of a low-k material and/or preferably a layer comprising tungsten, more preferably subjacent tungsten, and/or a layer comprising copper and/or cobalt on the surface of a semiconductor substrate, comprising as separate components:

(K1) a cleaning composition according to any of aspects 1 to 6;

and (K2) one or more oxidants, preferably selected from the group consisting of hydrogen peroxide, peroxide urea, peroxydisulfuric acid, ammonium persulfate, peroxymonosulfuric acid, pyrosulfuric acid, ozone and mixtures thereof; more preferably the one or one of the more oxidants is hydrogen peroxide;

and further optionally comprising, as separate component or combined with component (K1) and/or with component (K2):

(K3) one or more stabilizers, preferably selected from the group consisting of amine-N-oxides; citric acid; 1-hydroxyethane 1,1-diphosphonic acid; glycolic acid; lactic acid; hydroxybutyric acid; glyceric acid; malic acid; tartaric acid; malonic acid; succinic acid; glutaric acid; maleic acid and mixtures thereof.

EXAMPLES

The following examples are meant to further explain and illustrate the present invention without limiting its scope.

The following abbreviations are used in the Examples section:

*: also acting as weak acid component of buffering system (F)

5-Me-BTA: 5-methyl-benzotriazole (as defined above)

b: balance (to 100 mass-%)

BTA: benzotriazole (unsubstituted)

BDG: butyl diglycol

BTG: butyl triglycol

CDTA: 1,2-cyclohexylenedinitrilotetraacetic acid

DGMHE: diethylene glycol monohexyl ether

DGMME: diethylene glycol monomethyl ether

DIA: 1,3-dimethyl-2-imidazolidinone

DiAHP: diammonium hydrogen phosphate

DMSO: dimethyl sulfoxide
EDTMP: N,N,N,N-ethylenediaminetetrakis(methylene-phosphonic acid)
EGMBE: ethylene glycol monobutyl ether
EIS: ethyl isopropyl sulfone
NMMO: 4-methylmorpholine-4-oxide
ST: surface tension (in mN/m)
TEAH: tetraethyl ammonium hydroxide
TMAH: tetramethyl ammonium hydroxide
n.a.: no data available Example 1: Preparation of Cleaning Compositions According to the Invention The following cleaning compositions according to the invention (CCI1 to CCI7 and CCI 8 to CCI15) were prepared by mixing the components (A) to (H) in each case (as applicable). Details are given below in tables 1a and 1b. The indication of components (A) to (H) corresponds to the indication of components as defined above.

TABLE 1a

Cleaning compositions CCI1 to CCI7 according to the invention

| Component | Constituent | Cleaning Compositions [mass-%] | | | | | | |
|---|---|---|---|---|---|---|---|---|
| | | CCI1 | CCI2 | CCI3 | CCI4 | CCI5 | CCI6 | CCI7 |
| (A) | NMMO | 10-13 | 7-9 | 7-9 | 7-9 | 7-9 | 7-9 | 1-4 |
| (B) | 5-Me-BTA | 0.8-1.3 | 0.4-0.7 | 0.4-0.7 | 0.4-0.7 | 0.7-1.1 | 0.4-0.7 | 0.4-0.7 |
| (B) | BTA | 1.8-2.1 | 0.4-0.7 | 0.4-0.7 | 0.4-0.7 | 0.7-1.1 | 0.4-0.7 | 0.4-0.7 |
| (C) | DMSO | 0 | 0 | 8-11 | 8-11 | 7-9 | 8-11 | 8-11 |
| (C) | Sulfolane | 32-36 | 0 | 0 | 0 | 0 | 0 | 0 |
| (D) | Water | 43-47 | 48-52 | 24-27 | 48-52 | 46-51 | 39-42 | 48-52 |
| (E) | BDG | 0 | 0 | 52-57 | 28-31 | 0 | 0 | 19-22 |
| (E) | BTG | 0 | 0 | 0 | 0 | 0 | 38-41 | 0 |
| (E) | EGMBE | 0 | 38-41 | 0 | 0 | 0 | 0 | 0 |
| (E) | DGMHE | 0 | 0 | 0 | 0 | 0 | 0 | 12-16 |
| (E) | DGMME | 0 | 0 | 0 | 0 | 31-34 | 0 | 0 |
| (F) | $H_3PO_4$ | 0 | 0 | 0 | 0 | 0 | 0.1-0.3 | 0 |
| (F) | TEAH | 0.3-0.6 | 0.3-0.6 | 0.3-0.6 | 0.5-0.7 | 0.5-0.7 | 0.3-0.6 | 0.3-0.6 |
| (G) | CDTA* | 0.25-0.4 | 0.25-0.4 | 0.25-0.4 | 0.25-0.4 | 0.25-0.4 | 0.25-0.4 | 0.25-0.4 |
| (G) | EDTMP* | 0 | 0 | 0 | 0.05-0.12 | 0.05-0.12 | 0 | 0 |
| (H) | Fluorosurfactant | 0.02-0.05 | 0 | 0 | 0 | 0 | 0 | 0 |
| pH | | 7.7 | n.a. | n.a. | 7.7 | 7.8 | n.a. | n.a. |
| ST | | 52 | 29 | 33 | 34 | 34 | 34 | 34 |

TABLE 1b

Cleaning compositions CCI8 to CCI15 according to the invention

| Component | Constituent | Cleaning Compositions [mass-%] | | | | | | | |
|---|---|---|---|---|---|---|---|---|---|
| | | CCI8 | CCI9 | CCI10 | CCI11 | CCI12 | CCI13 | CCI14 | CCI15 |
| (A) | NMMO | 10-13 | 10-13 | 10-13 | 10-13 | 10-13 | 10-13 | 10-13 | 10-13 |
| (B) | 5-Me-BTA | 0.7-1.1 | 0.7-1.1 | 0.7-1.1 | 0.7-1.1 | 0.5-0.8 | 0.5-0.8 | 0.5-0.8 | 0.7-1.1 |
| (B) | BTA | 1.6-1.9 | 1.6-1.9 | 1.6-1.9 | 1.6-1.9 | 0.5-0.8 | 0.5-0.8 | 0.5-0.8 | 1.6-1.9 |
| (C) | DMSO | 0 | 0 | 0 | 9-11 | 9-11 | 0 | 0 | 0 |
| (C) | Sulfolane | 32-36 | 0 | 0 | 0 | 0 | 0 | 32-36 | 0 |
| (C) | EIS | 0 | 32-36 | 0 | 0 | 0 | 0 | 0 | 0 |
| (C) | DIA | 0 | 0 | 0 | 0 | 0 | 0 | 0 | 9-11 |
| (D) | Water | b | b | b | b | b | b | b | b |
| (E) | BDG | 0 | 0 | 32-36 | 32-36 | 28-32 | 28-32 | 0 | 32-36 |
| (F) | DiAHP | 0 | 0 | 0 | 0 | 0.5-1.5 | 0 | 0 | 0 |
| (F) | TMAH | 0.7-1.3 | 0.7-1.3 | 0.7-1.3 | 0.7-1.3 | 0 | 0.3-0.6 | 0.3-0.6 | 0.7-1.3 |
| (G) | CDTA* | 0.2-0.4 | 0.2-0.4 | 0.2-0.4 | 0.2-0.4 | 0.2-0.4 | 0.2-0.4 | 0.2-0.4 | 0.2-0.4 |
| (H) | Fluorosurfactant | 0.01-1.0 | 0.01-1.0 | 0 | 0 | 0 | 0.01-1.0 | 0.01-1.0 | 0 |
| pH | | 7.5 | n.a. | n.a. | n.a. | n.a. | n.a. | n.a. | n.a. |

Example 2: Preparation of Wet-Etch Compositions According to the Invention

The following wet-etch compositions according to the invention (WEI1 to WEI7, WEI8 to WEI11 and WEI15) were prepared by mixing the cleaning compositions of the invention CCI1 to CCI7, or CCI8 to CCI11, or CCI15, respectively (see Example 1), in each case with hydrogen peroxide ($H_2O_2$, 31% in water) in a sufficient amount to receive the final concentrations or mass ratios as shown in tables 2a and 2b below, where the "mass-% $H_2O_2$" in each case is given in relation to the total mass of the respective cleaning composition (CCI1 to CCI7, CCI8 to CCI11 and CCI15) utilized for preparing a certain wet-etch composition and where the "mass-% $H_2O_2$" in each case represents the amount or concentration of pure (undiluted) hydrogen peroxide present in the respective wet-etch composition.

TABLE 2a

Wet-etch compositions WEI1 to WEI7

| | Wet-etch Compositions | | | | | | |
|---|---|---|---|---|---|---|---|
| | WEI1 | WEI2 | WEI3 | WEI4 | WEI5 | WEI6 | WEI7 |
| Cleaning composition: | CCI1 | CCI2 | CCI3 | CCI4 | CCI5 | CCI6 | CCI7 |
| $H_2O_2$ (pure undiluted) [mass.-%]/ cleaning composition | 15-17 | 15-17 | 15-17 | 15-17 | 15-17 | 15-17 | 15-17 |
| pH: | 6.9 | 6.9 | 6.9 | 6.9 | 6.9 | 6.9 | 6.9 |

TABLE 2b

Wet-etch compositions WEI8 to WEI11 and WEI15

| | Wet-etch Compositions | | | | |
|---|---|---|---|---|---|
| | WEI8 | WEI9 | WEI10 | WEI11 | WEI15 |
| Cleaning composition: | CCI8 | CCI9 | CCI10 | CCI11 | CCI15 |
| $H_2O_2$ (pure, undiluted) [mass.-%]/ cleaning composition | 15-17 | 15-17 | 15-17 | 15-17 | 15-17 |
| pH: | 7.5 | 7.5 | 7.5 | 7.5 | 7.5 |

Example 3: Measurement of Etch Loss on TiN

The etch losses on layers of TiN caused by wet-etch compositions of the invention from Example 2 were determined according or analogous to methods described in document WO 2015/173730 A1. The wet-etch compositions were prepared by mixing the respective cleaning composition with the specified amount of hydrogen peroxide immediately before the etch-rate experiments were performed.

Si test wafers with layers of TiN (thicknesses of TiN layers were in the range of from 200 to 300 nm as physical vapour deposited TiN, "PVD TiN") were selected from appropriate commercial sources and broken into smaller coupons. The layer thicknesses and etch rates were then measured by X-ray fluorescence analysis (XRF) in a manner known per se. XRF is suitable for the non-contact and non-destructive thickness measurement of thin layers as well as for determining their chemical composition. For this type of measurement, the X-ray source and detector are located on the same side of a sample. When the layer on the substrate is subjected to X-rays, the radiation will penetrate the layer, if it is sufficiently thin, to a certain extent, depending on the thickness, and in turn cause characteristic fluorescence radiation in the material of the underlying substrate. On its way to the detector, this fluorescence radiation will be attenuated by absorption at the layer. The thickness of the layer can be determined based on the intensity attenuation of the fluorescence radiation of the substrate material.

For determining the initial film or layer thickness of the applicable material, an XRF recipe was created for the pristine wafers, based on reported layer thickness from the supplier and verified with transmission electron microscopy (TEM) cross-section.

The wet-etch compositions were then brought to the test temperature (59° C. for experiments of this Example 3) and stirred mechanically. The wafer coupons were fixed to a mechanical holder and were contacted with the wet-etch compositions for the reaction time (1 minute for experiments of this Example 3) in a beaker. Subsequently, the coupons were withdrawn from the wet-etch compositions and cleaned with ultra-pure water or with isopropyl alcohol or with a mixture of ultra-pure water and isopropyl alcohol, for a period of about 1 minute. Afterwards, the coupons were dried with nitrogen gas. The residual thickness of the TiN layers after etching was measured again as described above and the etch loss was calculated by subtracting the layer thickness after contact with the wet-etch composition from the thickness of the same layer before contact with the test composition. The results from this test (etch loss of TiN layer) are shown in table 3 below. All values for etch losses measured in examples 3 to 5 are given in Å, unless stated otherwise.

Example 4: Measurement of Etch Loss on Aluminium Oxide (AlOx), Cobalt and Copper Si wafers or wafer pieces (collectively referred to as "test wafers" in the following) with the appropriate types of outer layers (the thicknesses of Co layers were in the range of from 25 to 200 nm; the thicknesses of $AlO_x$ layers were about 20 nm; all outer layers relevant for performing the etch loss experiments were thick enough to allow obtaining meaningful measurement results post etch treatment) were obtained from commercial sources. The test wafers were pre-treated as applicable: Cu and Co were each immersed into an oxalic acid solution for 20-30 s and then rinsed with water and dried. $AlO_x$-coated surfaces were not pre-treated.

Aluminium oxide ($AlO_x$)-coated surfaces were used as a representative model for layers comprising or consisting of one or more aluminium compounds (as defined above).

The wet-etch compositions (see Example 2 and table 2 above) were prepared and the test wafers (see above) were contacted with the wet-etch compositions in a glass beaker, at a temperature of 59° C. and for a reaction time period of 10 min in the case of $AlO_x$ surfaces and Cu surfaces and for a reaction time period of 5 min in the case of cobalt surfaces, and then withdrawn from the wet-etch compositions, rinsed with water or isopropanol and dried with nitrogen gas.

The thicknesses of the copper, cobalt and aluminium oxide layers on the test wafers were determined before and after contact with the test compositions by X-ray fluorescence analysis (as explained in Example 3 above). Experiments were performed at least three times to ensure reproducibility.

The difference of the measured value of the thickness of a copper, cobalt or $AlO_x$-layer, respectively, before its contact with a wet-etch composition, minus the measured value of the thickness of the same copper, cobalt or $AlO_x$-layer, respectively, after its contact with the wet-etch composition was determined in each case as the resulting etch loss of the respective layer (as explained in Example 3 above). The results from this test (etch loss of Cu-, Co- or $AlO_x$-layer, respectively) are shown in table 3 below (each given value in table 3 representing the average of at least three experiments).

Example 5: Measurement of Etch Loss on Subjacent Tungsten Layers

Si test wafers with consecutive layers of (i) low-k material (top layer, layer thickness 75 Å), (ii) etch-stop layer consisting of one or more aluminium compounds ($AlO_x$-layer, as first subjacent layer under top layer, layer thickness 50 Å) and (iii) tungsten ("subjacent W") layer (layer comprising tungsten metal, layer thickness 1500 Å, as second subjacent layer under the first subjacent layer and placed on the surface of a Si test wafer), were prepared. The Si test wafer stacks so prepared and comprising (in the given order) (i) the low-k material layer, (ii) the etch-stop layer, (iii) the tungsten layer and (iv) the surface of the Si test wafer were sealed at all sides in a way that a wet-etch composition applied to the top layer (i) of the stacks (as done in the present experiment) could only get in contact with the tungsten layer (iii) by passing (penetrating or diffusing) through (i) the top layer and through (ii) the etch-stop layer (first subjacent layer).

The Si test wafer stacks were then etched by contacting them with wet-etch compositions prepared according to Example 2 above in an etch-process equivalent to the etch-process as described in Example 3 above (applicable test temperature in this example 5: 59° C., applicable reaction time in this example 5: 1 minute). The thickness of the tungsten layer before and after etching was then determined according to the method as explained in Example 3 above and the respective etch loss of the tungsten layer was calculated as explained in Example 3. The results from this test are shown in table 3 below.

TABLE 3

Results from etch tests on subjacent tungsten layers with wet-etch compositions according to the invention

| Etch loss of layer [Å]: | Wet-etch Composition of the Invention WEI1 | WEI2 | WEI3 | WEI4 | WEI5 | WEI6 | WEI7 |
|---|---|---|---|---|---|---|---|
| TiN | 102 | n.a. | n.a. | 105 | 105 | n.a. | n.a. |
| Cu | 15 | n.a. | n.a. | 16 | 14 | n.a. | n.a. |
| Co | 2.6 | n.a. | n.a. | 2 | 2 | n.a. | n.a. |
| $AlO_x$ | 5 | n.a. | n.a. | 1 | 2 | n.a. | n.a. |
| Subjacent W | 15 | 22 | 18 | 6 | 4 | 4 | 6 |

From the results shown in table 3 above it can be seen that at least wet-etch compositions WEI1, WEI 4 and WEI5 had excellent etch rate selectivities for TiN (for selectively etching hard masks comprising or consisting of TiN) and AlOx (for selectively removing etch-stop-layers comprising or consisting of one or more aluminium compounds), Cu (for preserving any copper present in the etching step to the highest possible extent) and Co (for preserving any copper present in the etching step to the highest possible extent). It can therefore be concluded that all wet-etch compositions WEI1 to WEI7 are suited for application in manufacturing processes for 10 nm structures or sub-10 nm structures, e.g. for 7 nm structures, on a semiconductor substrate, including in 1-step threefold removal steps of said processes as explained above.

It can further be seen from the results shown in table 3 above that wet-etch compositions WEI4, WEI5, WEI6 and WEI7 according to the present invention (all showing beneficial etch losses on subjacent W layers of <10 nm under the test conditions of Example 5) are in addition excellently suited for application in manufacturing processes for 7 nm structures or sub-7 nm structures, e.g. for 5 nm structures, on a semiconductor substrate, including in 1-step threefold removal steps of said processes as explained above.

Example 6: Measurement of Etch Loss on TiN as a Function of Age of Wet-Etch Compositions Similar as in Example 3 above, the etch losses of TiN caused by wet-etch compositions WEI8 to WEI11 and WEI15 of the invention from Example 2 above (see table 2b) were determined according or analogous to methods described in document WO 2015/173730 A1.

In the present Example 6, Si test wafers (12 inch) with layers of TiN (thickness of TiN layers about 300 nm as PVD TiN) were loaded into 100 mL of the wet-etch compositions as specified in table 4 below and held therein at a temperature of 60° C. in each case for time intervals as also specified in table 4 below. After each time interval, the remaining thickness of the TiN layer on a test wafer was determined as explained in Example 3 above, and compared to the thickness of the TiN layer of the same test wafer at the beginning of the experiment. The remaining activity of a wet-etch compositions tested in this experiment after a certain time interval is then given in the format of an etch rate in Ångstrom/min (Å/min), as is common in the field. The results of this experiment are shown in table 4 below (figures shown in table 4 are within the precision of measurement of the method applied).

TABLE 4

Results from etch tests on TiN layers with wet-etch compositions according to the invention as a function of age of wet-etch composition

| Time interval after start of experiment Etch rate: | Wet-etch Compositions WEI8 | WEI9 | WEI10 | WEI11 | WEI15 |
|---|---|---|---|---|---|
| | Etch rate [Å/min] | | | | |
| Start (wet-etch composition freshly prepared) | 150 | 153 | 151 | 153 | 123 |
| 1.5 hrs | 150 | 153 | 150 | 152 | 120 |
| 3.5 hrs | 149 | 153 | 154 | 146 | 122 |
| 5.5 hrs | 150 | 153 | 130 | 138 | 123 |
| 7.5 hrs | 152 | 154 | 100 | 103 | 129 |
| 12 hrs | 153 | 155 | 78 | 58 | 115 |
| 24 hrs | 155 | 158 | 54 | 39 | 108 |

From the results shown in table 4 above it can be seen that a wet-etch composition according to the invention, in particular when comprising as polar, non-protogenic organic solvent (C) (only) an alkyl sulfone compound of formula IV, more in particular when comprising as polar, non-protogenic organic solvent (C) sulfolane or ethyl isopropyl sulfone, (but no alkyl glycol ether (E)) provides stable etch rates for TiN layers over extended time periods. In the present experiment, the etch rate of such wet-etch compositions according to the invention (see e.g. WEI8 and WEI 9) performed on a TiN layer was stable and did not decrease (within the measuring accuracy of the test method) for a period of at least 24 hours.

From the results shown in table 4 above it can also be seen that wet-etch compositions comprising one or more alkyl glycol ethers (E) (but no polar, non-protogenic organic solvent (C)) as defined herein, provided stable etch rates for TiN layers over somewhat shorter time periods.

From the results shown in table 4 above, it can further be seen that wet-etch compositions comprising one or more alkyl glycol ethers (E) and a polar, non-protogenic organic solvent (C) as defined herein, but no alkyl sulfone compound of formula IV as defined herein, provided stable etch rates for TiN layers over somewhat shorter time periods.

In addition, it can be seen from the results shown in table 4 above that the etch rate of wet-etch compositions comprising one or more alkyl glycol ethers (E) as defined herein and as a polar, non-protogenic organic solvent (C) as defined herein 1,3-dimethyl-2-imidazolidinone (but no alkyl sulfone compound of formula IV as defined herein, see e.g. WEI15) showed etch rates for TiN layers at a level nearly comparable to the level of a wet-etch composition comprising as polar, non-protogenic organic solvent (C) an alkyl sulfone compound of formula IV, for a period of at least 24 hours.

Example 7: Measuring of Particle Count in the Nanometer to Micrometer Range in Cleaning Compositions Cleaning compositions CCI12, CCI13 and CCI14 were prepared (200 mL each) as explained in Example 1 above and filtered. Subsequent to filtration, the amount of liquid particles of particle sizes of 0.15 μm, 0.2 μm, 0.3 μm and 0.5 μm were determined by means of a liquid-borne particle counter (Rion KS 40 A or Rion KS 19 F, Rion Co., Ltd., JP).

It was found in this experiment that cleaning composition CCI14 comprised the lowest amount of particles in all particle size categories (see above), followed by cleaning composition CCI13 and then cleaning composition CCI12. From this result it can be concluded that cleaning composition CCI14 (comprising as polar, non-protogenic organic solvent (C) an alkyl sulfone compound of formula IV (sulfolane)), had the most beneficial inhibitory effect on particle aggregation of the cleaning compositions tested.

Example 8: Measuring of Particle Count in the Nanometer to Micrometer Range on the Surface of a Semiconductor Substrate Cleaning compositions according to the present invention were prepared (see Example 1 above) and applied to the surfaces of full 300 mm non-patterned wafer (SiO surface). The wafers were then fully processed, including rinsing and drying. Subsequently, the surfaces of the processed wafers were inspected with a commercial unpatterned wafer surface inspection system (KLA Tencor Corp., USA: Surfscan® SP3, SP5 or SP7, respectively) for particle count on their surfaces.

It was found that a wafer treated with cleaning composition CCI1 in the present experiment showed a particularly low particle count on its surface after treatment.

Example 9: Measurement of Etch Loss on Aluminium Oxide (A10) Layers as a Function of pH Values of Wetch-Etch Compositions Similar as in Example 4 above, test wafers were obtained with 3 different types of $AlO_x$-outer layers.

The wet-etch compositions (see Example 2 and table 2 above) were prepared and the etch rates of the wet-etch compositions were determined as explained in Example 4 above or analogously to the method as explained in Example 4 above, at a temperature of 60° C.

The etch rates of the wet-etch compositions according to the invention were determined on two different sets of wafer surfaces as explained in Example 3 or Example 4 above, or analogously to these methods: on one set of wafer surfaces carrying 3 different types of $AlO_x$-outer layers where no plasma etch had been performed (control) and on another set of wafer surfaces carrying 3 different types of $AlO_x$-outer layers where plasma etch had been performed. The results of this experiment are shown in table 5 below.

TABLE 5

Results from etch tests on different types of $AlO_x$-outer layers as a function of pH-values of wet-etch compositions

| $AlO_x$-type/wafer surface | Wet-etch Compositions WEI8 | WEI1 | WEI16 |
|---|---|---|---|
| | Etch rate [Å/min] | | |
| $AlO_x$-type 1/no plasma etch | 4 | 0.9 | 0.8 |
| $AlO_x$-type 1/plasma etch | 5.6 | 2 | 0.7 |
| $AlO_x$-type 2/no plasma etch | 2.4 | 0.8 | 0.7 |
| $AlO_x$-type 2/plasma etch | 5.4 | 1.8 | 1.5 |
| $AlO_x$-type 3/no plasma etch | 2.1 | 0.8 | 0.5 |
| $AlO_x$-type 3/plasma etch | 7.1 | 2.7 | 2.2 |

Wet-etch compositions WEI1 and WEI8 were prepared as described above (see Examples 1 and 2). Wet-etch composition WEI16 was prepared analogously to WEI1 from a cleaning composition which was identical to CCI1, with the exception that the content of tetra ethyl ammonium hydroxide (TEAH) was lower in the cleaning composition used for preparation of wet-etch composition WEI16 and was in the range of between 0.1-0.4 mass-%, relative to the total mass of the cleaning composition. The pH of wet-etch composition WEI16 was 6.5.

From the results in table 5 above it can be seen that the wet-etch compositions according to the invention which have pH values in the range of from 6 to 9, preferably of from 6.5 to 8.0, show etch-rates on different types of layers comprising an aluminium compound (different types of $AlO_x$-outer layers), which makes said wet-etch compositions excellently suited for a very controlled and specific etching of a layer comprising or consisting of one or more aluminium compounds.

The invention claimed is:

1. A cleaning composition, comprising at least the following components:

(A) as solubilizer, one or more compounds of formula I:

(I)

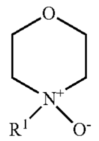

wherein $R^1$ is selected from the group consisting of branched and unbranched alkyl having 1, 2, 3 or 4 carbon atoms; wherein the total amount of the one or more solubilizers (A) is in a range of from 1 mass-% to 15 mass-%, relative to the total mass of the cleaning composition;

(B) one or more corrosion inhibitors, selected from the group consisting of benzotriazoles which are unsubstituted or substituted once or twice independently by branched or unbranched alkyl having 1, 2, 3 or 4 carbon atoms, aminoalkyl wherein the alkyl is branched or unbranched and has 1, 2, 3 or 4 carbon atoms, phenyl, thiophenyl, halogen, hydroxy, nitro and/or thiol, and mixtures thereof, wherein the total amount of the one or more corrosion inhibitors (B) is in a range of from 0.1 mass-% to 6 mass-%, relative to the total mass of the cleaning composition;

(C) one or more polar, non-protogenic organic solvents selected from the group consisting of alkyl sulfone compounds of formula IV:

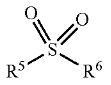

(IV)

wherein $R^5$ is a branched or unbranched alkyl group having 1 to 5 carbon atoms, $R^6$ is a branched or unbranched alkyl group having 1 to 5 carbon atoms, or $R^5$ and $R^6$ together form a branched or unbranched alkylene group having 3 to 5 carbon atoms, wherein one or two carbon atoms of said alkylene group can independently be substituted by —O—$R^7$, wherein $R^7$ is a branched or unbranched alkyl group having 1 to 4 carbon atoms;

and (D) water, wherein the one, or more, polar, non-protogenic organic solvents (C) is present in the range of from >30 mass-% to 50 mass-% relative to the total mass of the cleaning composition;

wherein the total amount of etchants comprising fluoride anions is <0.001 mass-%, relative to the total mass of the cleaning composition.

2. A method for removing post-etch or post-ash residue from the surface of a semiconductor substrate by contacting the surface with the cleaning composition according to claim 1.

3. The cleaning composition according to claim 1, wherein the cleaning composition further comprises (F) a buffering system which is suitable to buffer the pH of the cleaning composition in the range of from 6 to 9.

* * * * *